US009705223B2

(12) United States Patent
Miyazaki

(10) Patent No.: US 9,705,223 B2
(45) Date of Patent: Jul. 11, 2017

(54) SOCKET, CONNECTOR USING SUCH SOCKET, AND HEADER USED IN SUCH CONNECTOR

(71) Applicant: Panasonic Intellectual Property Management Co., Ltd., Osaka (JP)

(72) Inventor: Yoji Miyazaki, Mie (JP)

(73) Assignee: Panasonic Intellectual Property Management Co., Ltd., Osaka (JP)

( * ) Notice: Subject to any disclaimer, the term of this patent is extended or adjusted under 35 U.S.C. 154(b) by 0 days.

(21) Appl. No.: 15/022,014

(22) PCT Filed: Oct. 31, 2013

(86) PCT No.: PCT/JP2013/006473
§ 371 (c)(1),
(2) Date: Mar. 15, 2016

(87) PCT Pub. No.: WO2015/063817
PCT Pub. Date: May 7, 2015

(65) Prior Publication Data
US 2016/0226173 A1 Aug. 4, 2016

(51) Int. Cl.
*H01R 12/00* (2006.01)
*H05K 1/00* (2006.01)
(Continued)

(52) U.S. Cl.
CPC ........... *H01R 13/20* (2013.01); *H01R 12/707* (2013.01); *H01R 12/716* (2013.01); *H01R 12/73* (2013.01);
(Continued)

(58) Field of Classification Search
CPC .... H01R 12/52; H01R 12/716; H01R 12/707; H01R 13/20
(Continued)

(56) References Cited

U.S. PATENT DOCUMENTS 7,410,364 B2 * 8/2008 Kishi .................. H01R 12/716 439/566
7,465,171 B2 * 12/2008 Miyazaki ............... H01R 13/20 439/74
(Continued)

FOREIGN PATENT DOCUMENTS

JP 2012-164528 A 8/2012
JP 2012-186110 A 9/2012
(Continued)

OTHER PUBLICATIONS

International Search Report issued in Application No. PCT/JP2013/006473 dated Feb. 4, 2014, with English translation.

*Primary Examiner* — Hae Moon Hyeon
(74) *Attorney, Agent, or Firm* — McDermott Will & Emery LLP

(57) ABSTRACT

A socket-side retaining fitting includes: a rising portion extending toward a header; a locking piece portion being a part continuing to an upper end portion of the rising portion while curving, and configured to lock a locked portion of a header-side retaining fitting attached to the header. A socket housing includes a covering portion provided in such a way as to cover at least part of the locking piece portion, and configured to restrict movement of the locking piece portion.

6 Claims, 34 Drawing Sheets

(51) Int. Cl.

| | |
|---|---|
| ***H01R 13/20*** | (2006.01) |
| ***H01R 12/70*** | (2011.01) |
| ***H01R 12/71*** | (2011.01) |
| ***H01R 12/73*** | (2011.01) |
| ***H01R 13/627*** | (2006.01) |
| *H01R 13/24* | (2006.01) |

(52) U.S. Cl.
CPC ..... *H01R 13/6275* (2013.01); *H01R 13/2435* (2013.01)

(58) Field of Classification Search
USPC .............................................. 439/74, 83, 566
See application file for complete search history.

(56) References Cited

U.S. PATENT DOCUMENTS

| | | | | |
|---|---|---|---|---|
| 7,717,719 B2 * | 5/2010 | Miyazaki | H01R 12/57 | 439/74 |
| 7,722,408 B2 * | 5/2010 | Miyazaki | H01R 13/516 | 439/570 |
| 7,845,958 B2 * | 12/2010 | Hoshino | H01R 13/6275 | 439/660 |
| 8,052,457 B2 * | 11/2011 | Miyazaki | H01R 13/6275 | 439/357 |
| 8,272,881 B2 * | 9/2012 | Miyazaki | H01R 13/20 | 439/345 |
| 8,845,339 B2 * | 9/2014 | Ono | H01R 12/712 | 439/74 |
| 8,992,234 B2 * | 3/2015 | Yoshioka | H01R 12/7029 | 439/74 |
| 9,178,309 B2 * | 11/2015 | Tanaka | H01R 13/631 | |
| 2014/0227899 A1 | 8/2014 | Tanaka et al. | | |

FOREIGN PATENT DOCUMENTS

| | | |
|---|---|---|
| JP | 2013-065541 A | 4/2013 |
| WO | 2012/108279 A1 | 8/2012 |
| WO | 2013/031139 A1 | 3/2013 |

* cited by examiner

SOCKET, CONNECTOR USING SUCH SOCKET, AND HEADER USED IN SUCH CONNECTOR

RELATED APPLICATIONS

This application is the U.S. National Phase under 35 U.S.C. §371 of International Application No. PCT/JP2013/006473, filed on Oct. 31, 2013, the disclosure of which is incorporated by reference herein.

TECHNICAL FIELD

The present invention relates to: a socket configured to electrically connect electronic components together; a connector using the socket; and a header used in the connector.

BACKGROUND ART

Connectors have conventionally been used to electrically connect electronic components. A connector is such that electrical connection is established by bringing terminals provided to a socket and terminals provided to a header into contact with each other. The header and the socket are locked to each other using header-side retaining fittings and socket-side retaining fittings. With regard to the technique, PTL 1 discloses that the locking piece portion of each socket-side retaining fitting locks the locked portion of the corresponding header-side retaining fitting.

CITATION LIST

Patent Literature

Patent Literature 1: Japanese Unexamined Patent Application Publication No. 2013-65541

SUMMARY OF INVENTION

Technical Problem

There may be a case where an electronic device in which the conventional connector falls and collides against the ground. In this case, force is applied to the electronic device in such a way as to pull the locked portion of the header-side retaining fitting out of the locking piece portion of the socket-side retaining fitting. This causes flexure in the cantilevered beam whose tip end curves, and the locking piece portion moves. As a result, the header-side retaining fitting may come off the socket-side retaining fitting. In other words, a problem arises in which the header-side retaining fitting is unlocked from the socket-side retaining fitting under a situation where the unlocking is not allowed.

The present invention has been made with the foregoing situation taken into consideration. An object of the present invention is to provide a socket, a connector using the socket, and a header used in the connector, which are capable of preventing the header-side retaining fitting from being unlocked from the socket-side retaining fitting under a situation where the unlocking is not allowed.

Solution to Problem

A socket according to an embodiment of the present invention includes a socket-side terminal and being configured to be electrically connected to a header including a header-side terminal coming in contact with the socket-side terminal. The socket includes: a socket housing to which the socket-side terminal is attached; and a socket-side retaining fitting attached to the socket housing. The socket-side retaining fitting includes: a rising portion extending toward the header; and a locking piece portion being a part continuing to an upper end portion of the rising portion while curving, and configured to lock a locked portion of a header-side retaining fitting attached to the header. The socket housing includes a covering portion provided in such a way as to cover at least part of the locking piece portion, and configured to restrict movement of the locking piece portion.

A lower end portion of the rising portion is desirably fixed to a circuit board using solder. In this case, the covering portion is desirably placed at such a position as to prevent the solder, as melted, from rising up to the locking piece portion along a surface of the rising portion.

The socket housing as a whole may be shaped substantially like a rectangular parallelepiped. The socket-side retaining fitting may include: a central portion provided in such a way as to be exposed at a side surface of the socket housing; and an arm portion extending from the central portion to a predetermined position in a front surface of the socket housing in such a way as to be exposed at the front surface. The socket-side retaining fitting may include a leg portion extending from the central portion along a bottom surface of the socket housing, and projecting from the front surface of the socket housing. In the case described above, the leg portion is desirably fixed to the circuit board using different solder.

The socket housing as a whole may be shaped substantially like a rectangular parallelepiped. The socket-side retaining fitting may include: a central portion provided in such a way as to be exposed at a side surface of the socket housing; and an arm portion extending from the central portion to a predetermined position in a front surface of the socket housing in such a way as to be exposed at the front surface. Moreover, the rising portion may extend from a tip end portion of the arm portion toward the header. The locking piece portion may penetrate the covering portion while curving from the upper end portion of the rising portion toward an inside of the rectangular parallelepiped, and project to a space inside edge portions of the socket housing.

The socket-side retaining fitting may be attached to the socket housing by insert molding. In this case, the covering portion is desirably formed integrally with the rest of the socket housing, other than the covering portion, by the insert molding.

A connector according to the embodiment of the present invention includes: a socket according to any one of the above descriptions; and a header configured to be electrically connected to the socket.

A header according to the present invention is configured to be used in the connector described above.

Advantageous Effects of Invention

The present invention makes it possible to prevent the header-side retaining fitting from being unlocked from the socket-side retaining fitting under a situation where the unlocking is not allowed.

BRIEF DESCRIPTION OF DRAWINGS

FIG. 5 is the diagram showing how the header and the socket of the embodiment of the present invention look immediately before the header and the socket are fitted together.

FIG. 5 is the diagram showing how the header and the socket of the embodiment of the present invention look while the header and the socket are fitted together.

FIG. 5 is the diagram showing how the header and the socket of the embodiment of the present invention look immediately before the header and the socket are fitted together.

FIG. 5 is the diagram showing how the header and the socket of the embodiment of the present invention look while the header and the socket are fitted together.

DESCRIPTION OF EMBODIMENTS

Figure 1:
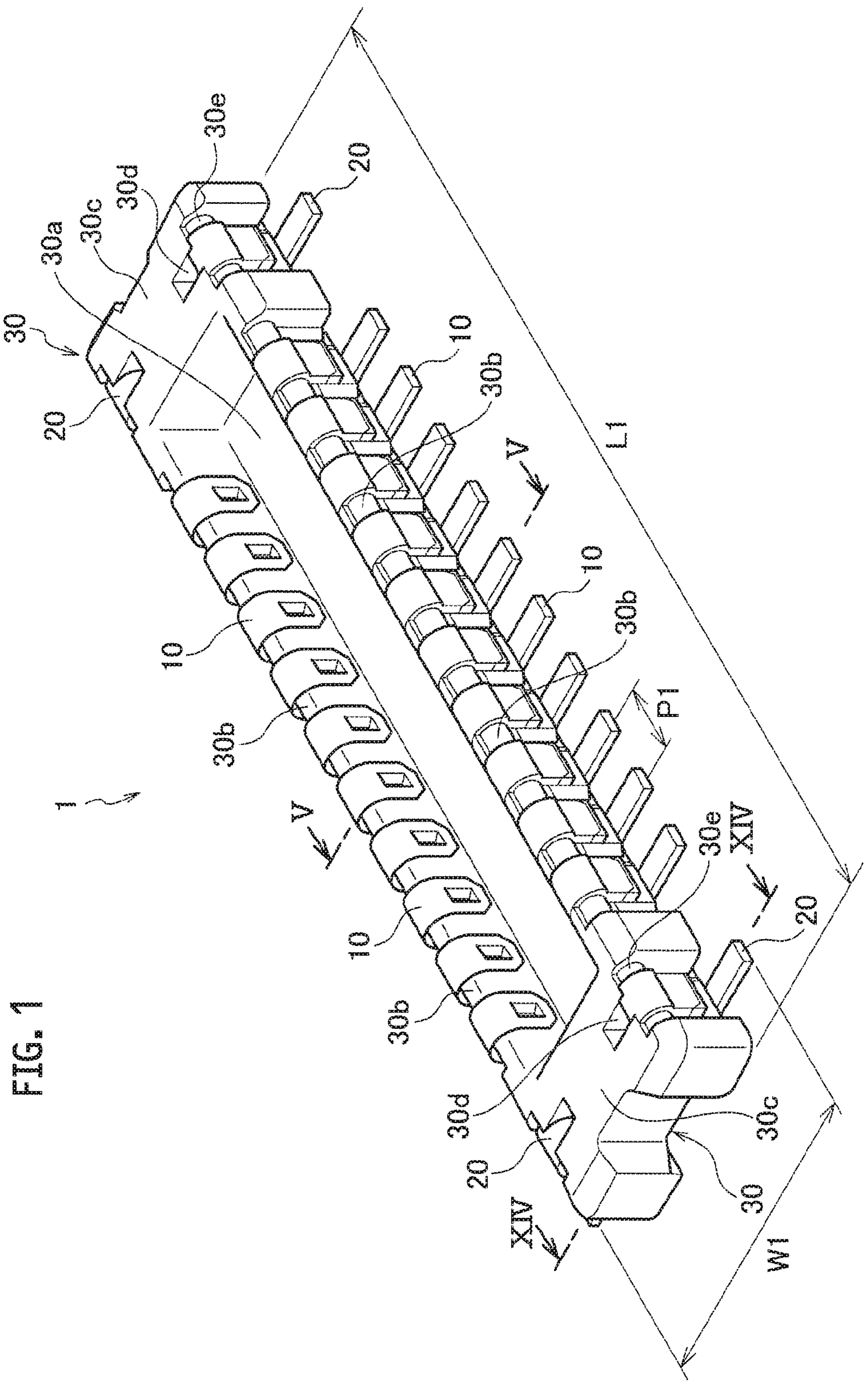
FIG. 1 is a first perspective view of a header of an embodiment of the present invention.

Referring to the drawings, descriptions will be hereinbelow provided for a socket, a connector using the socket, and a header used in the connector of an embodiment of the present invention.

The connector of the embodiment is designed to be used to electrically connect circuit boards together in an electronic device as a mobile terminal device such as a smartphone. Note that, the connector of the present invention may be used to electrically connect any components together as long as the connector is used in the electronic device.

The connector of the embodiment includes a header and a socket. The header is a component designed to be electrically connected to a conductor wiring pattern on a certain circuit board, or a printed circuit board, in the electronic device. The socket is a component designed to be electrically connected to a conductor wiring pattern on another circuit board. Incidentally, the header and the socket may be electrically connected to FPCs (Flexible Printed Circuits).

Figure 2:
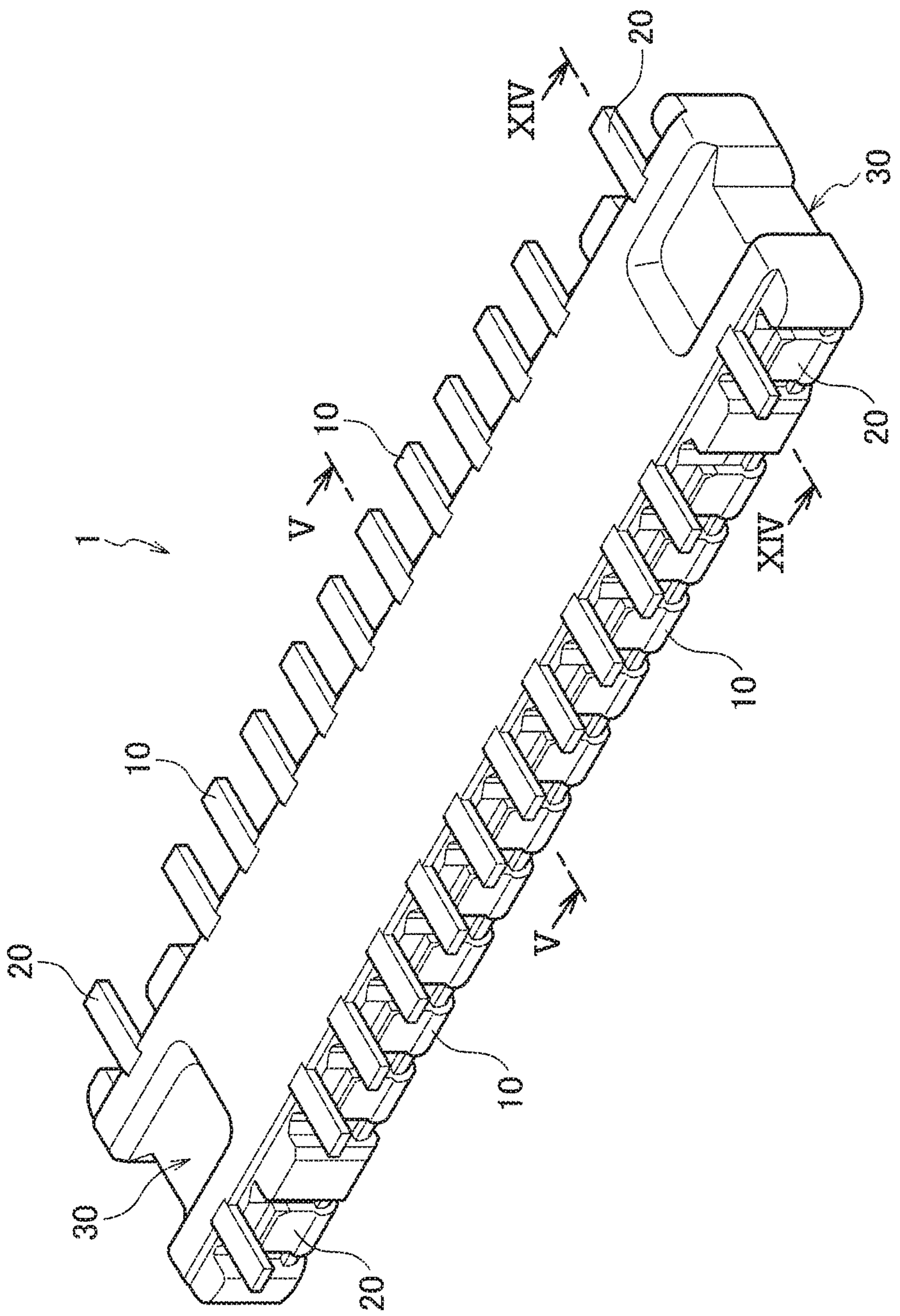
FIG. 2 is a second perspective view of the header of the embodiment of the present invention.

Referring to FIGS. 1 and 2, descriptions will be provided for a header 1 included in the connector of the embodiment of the present invention.

The header 1 includes: metal-made header-side terminals 10 each called a post; metal-made header-side retaining fittings 20; and a resin-made header housing 30. A specified part of each header-side terminal 10 is exposed to the outside. The other part of the header-side terminal 10 is attached to the header housing 30 by insert molding. With regard to each header-side retaining fitting 20, too, its specified part is exposed to the outside, and its other part is attached to the header housing 30 by insert molding.

With regard to dimensions of the header 1, its width W1 and length L1 shown in FIG. 1 are 1.50 mm and 5.15 mm, respectively. The pitch P1 between each two of the header-side terminals 10 shown in FIG. 1 is 0.35 mm. Hereinafter, a direction specified by the width W1 shown in FIG. 1 will be referred to as a "width direction" of the header, and a direction specified by the length L1 shown in FIG. 1 will be referred to as a "lengthwise direction" of the header.

The header housing 30 is produced by resin molding, and is an electrically-insulated component. As shown in FIGS. 1 and 2, the header housing 30 has an external shape with all the surfaces of it shaped almost like a rectangular plate. That is to say, the external shape of the header housing 30 is an almost rectangular parallelepiped. A recessed portion is formed in a central portion of one principal surface of the header housing 30. The recessed portion in the central portion is formed from a bottom surface portion 30*a*, two edge portions 30*b* and two edge portions 30*c*. The two edge portions 30*b* each extend in the lengthwise direction of the header 1, or in a long-side direction of the rectangle, and both face each other. The two edge portions 30*c* each extend in the width direction of the header 1, or in a short-side direction of the rectangle, and both face each other. The recessed portion in the central portion forms a space shaped almost like a rectangular parallelepiped which is slightly smaller than the external shape of the header housing 30 shaped almost like a rectangular parallelepiped. Recessed portions 30*d* are formed in each edge portion 30*c*.

Each header-side terminal 10 is produced by metal forming, and is a conductive component. As described later, one end of the header-side terminal 10 is designed to be connected to a conductor wiring pattern on a circuit board.

As shown in FIGS. 1 and 2, each header-side terminal 10 extends from a predetermined position on an outer surface of the corresponding edge portion 30*b* to a tip end portion of the edge portion 30*b*, and curves along the surface of the tip end portion of the edge portion 30*b*. Furthermore, the header-side terminal 10 extends along an inner surface of the edge portion 30*b* from the tip end portion of the edge portion 30*b* to a joining portion where the bottom surface portion 30*a* and the edge portion 30*b* are joined together. In addition, the header-side terminal 10 penetrates the joining portion while curving. Moreover, after penetrating the joining portion, the header-side terminal 10 projects from the front surface (or rear surface) of the header housing 30. Detailed description will be provided for the shape of the header-side terminal 10 later.

The header-side retaining fitting 20 are each made of the same metal as the header-side terminals 10 are. Note that, because the header-side retaining fitting 20 are used to be connected to socket-side retaining fittings 50, the header-side retaining fitting 20 are made of the metal from a viewpoint of strength of their material, but not from a viewpoint of their function as conductive components. As shown in FIGS. 1 and 2, the header-side retaining fitting 20 have the same shape as the header-side terminals 10 do. To put it concretely, each header-side retaining fitting 20 extends from a predetermined position on an outer surface of a corresponding edge portion 30*e*, whose shape is similar to those of the edge portions 30*b*, to a tip end portion of the edge portion 30*e*, and curves along the surface of the tip end portion of the edge portion 30*e*. Furthermore, the header-side retaining fitting 20 extends along an inner surface of the edge portion 30*e* from the tip end portion of the edge portion 30*e* to a joining portion where the bottom surface portion 30*a* and the edge portion 30*e* are joined together. In addition, the header-side retaining fitting 20 penetrates the joining portion while curving. Moreover, after penetrating the joining portion, the header-side retaining fitting 20 projects from the front surface (or rear surface) of the header housing 30. Detailed description will be provided for the shape of the header-side retaining fitting 20 later.

Both the header-side terminals 10 and the header-side retaining fittings 20 are each formed by curving a metal-made plate material as a base material.

Figure 3:
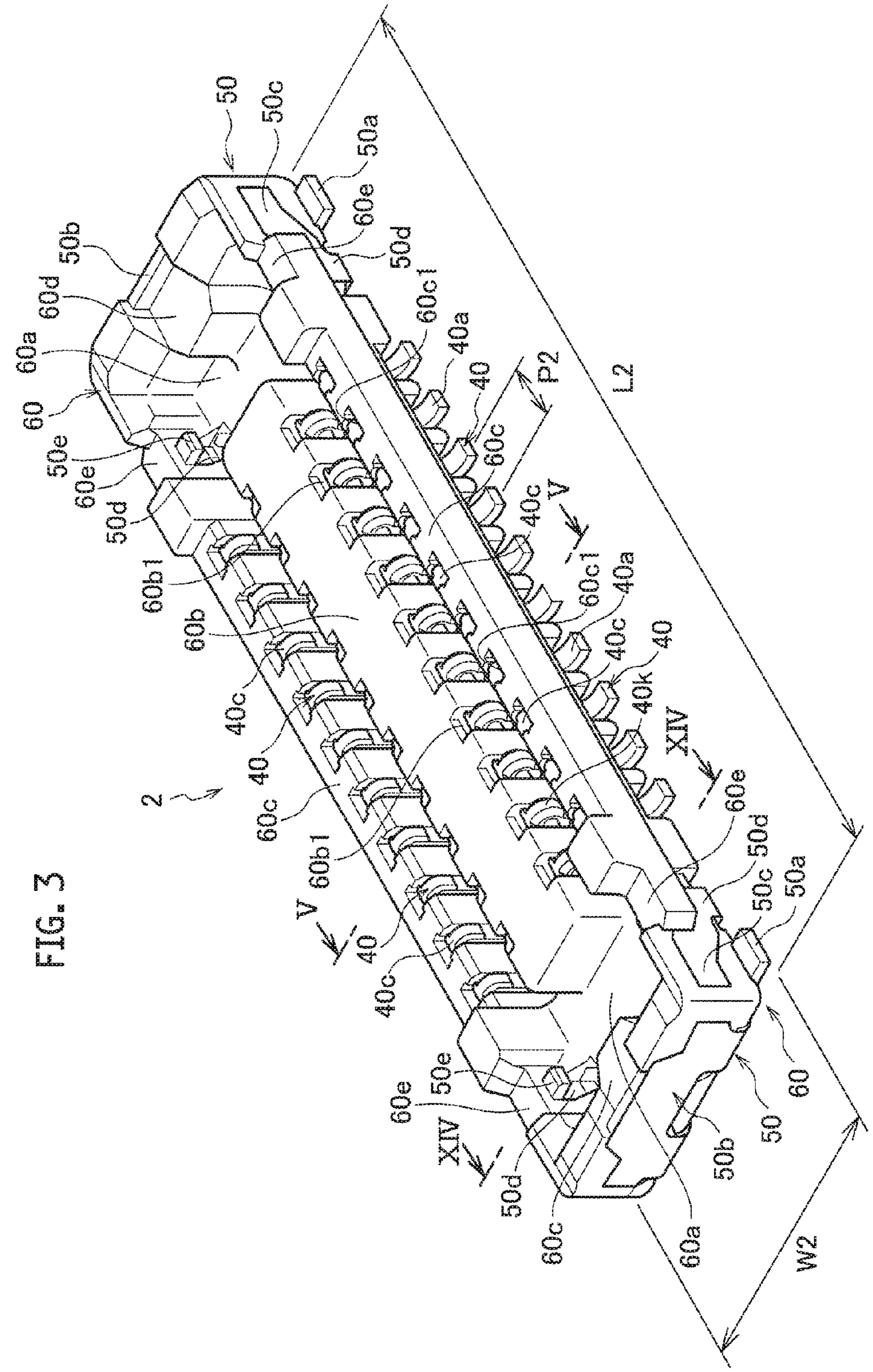
FIG. 3 is a first perspective view of a socket of the embodiment of the present invention.
Figure 4:
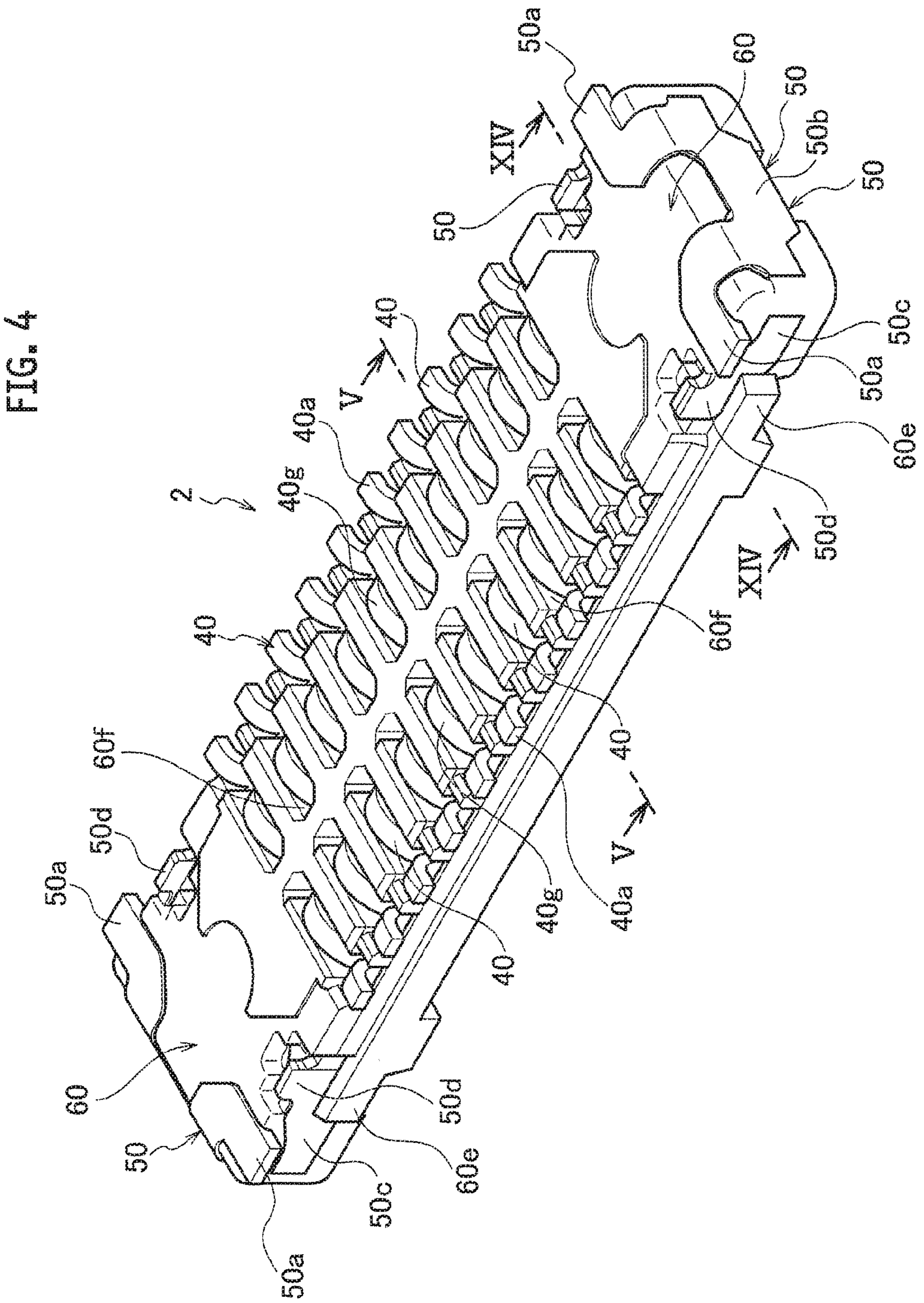
FIG. 4 is a second perspective view of the socket of the embodiment of the present invention.

Next, referring to FIGS. 3 and 4, descriptions will be provided for a socket 2 included in the connector of the embodiment of the present invention.

As shown in FIGS. 3 and 4, the socket 2 includes: metal-made socket-side terminals 40 each called a contact; the metal-made socket-side retaining fittings 50; and a resin-made socket housing 60. A specified part of each socket-side terminal 40 is exposed to the outside, while the other part of the socket-side terminal 40 is attached to the socket housing 60 by insert molding. With regard to each socket-side retaining fitting 50, too, its specified part is exposed to the outside, and its other part is attached to the socket housing 60 by insert molding.

With regard to dimensions of the socket 2, its width W2 and length L2 shown in FIG. 3 are 1.70 mm and 5.85 mm, respectively. The pitch P2 between each two of the socket-side terminals 40 shown in FIG. 3 is 0.35 mm. Hereinafter, a direction specified by the width W2 shown in FIG. 3 will be referred to as a “width direction” of the socket, and a direction specified by the length L2 shown in FIG. 3 will be referred to as a “lengthwise direction” of the socket.

The socket housing 60 is produced by resin molding, and is an electrically-insulated component. As shown in FIGS. 3 and 4, the socket housing 60 has an external shape with all the surfaces of it shaped almost like a rectangular plate. That is to say, the external shape of the socket housing 60 is an almost rectangular parallelepiped. The socket housing 60 includes a frame-shaped space 60*a* extending along the four sides of the rectangle of the socket housing 60. The frame-shaped space 60*a* is surrounded by two edge portions 60*c* and two edge portions 60*d*. The two edge portions 60*c* each extend in the lengthwise direction of the socket, or in a long-side direction of the rectangle, and both face each other. The two edge portions 60*d* each extend in the width direction of the socket, or in a short-side direction of the rectangle, and both face each other. The frame-shaped space 60*a* surrounds an island portion 60*b* positioned at the center of the frame-shaped space 60*a*, and shaped almost like a rectangular parallelepiped. The island portion 60*b* is provided with cut portions 60*b*1. In addition, the edge portions 60*c* are provided with cut portions 60*c*1. The cut portions 60*b* and the cut portions 60*c*1 continue to cut portions 60*f* in the bottom surface of the socket 2.

Each socket-side terminal 40 is produced by metal forming, and is a conductive component. The socket-side terminal 40 is provided extending from the cut portions 60*b*1, the frame-shaped space 60*a*, and the cut portion 60*f* to the cut portion 60*c*1. Furthermore, the socket-side terminal 40 projects from the corresponding edge portion 60*c*. Detailed description will be provided for the shape of the socket-side terminal 40 later.

The socket-side retaining fittings 50 are attached in order for part of each socket-side retaining fitting 50 to increase the strength of the socket housing 60. The socket-side retaining fittings 50 are made of metal. Incidentally, the socket-side retaining fittings 50 and the socket-side terminals 40 may be made from the same material. Note that, the socket-side retaining fittings 50 are made of metal from a viewpoint of the strength, but not from a viewpoint of the conductive material. Each socket-side retaining fitting 50 covers the corresponding side surface of the socket housing 60 extending in the width direction of the socket 2. Furthermore, the socket-side retaining fitting 50 partially covers the front surface and rear surface of the socket housing 60 which extend in the lengthwise direction of the socket 2. Parts of the socket-side retaining fitting 50 penetrate the respective edge portions 60*c* of the socket housing 60. To put it concretely, the parts of the socket-side retaining fitting 50 penetrate parts of the socket housing 60, which are under corresponding covering portions 60*e*, from the outside toward the inside to project toward the frame-shaped space 60*a*. Detailed descriptions will be provided for the shape of the socket-side retaining fitting 50 later.

It should be noted that both the socket-side terminals 40 and the socket-side retaining fittings 50 are each formed by curving a metal-made plate material as a base material.

Figure 5:
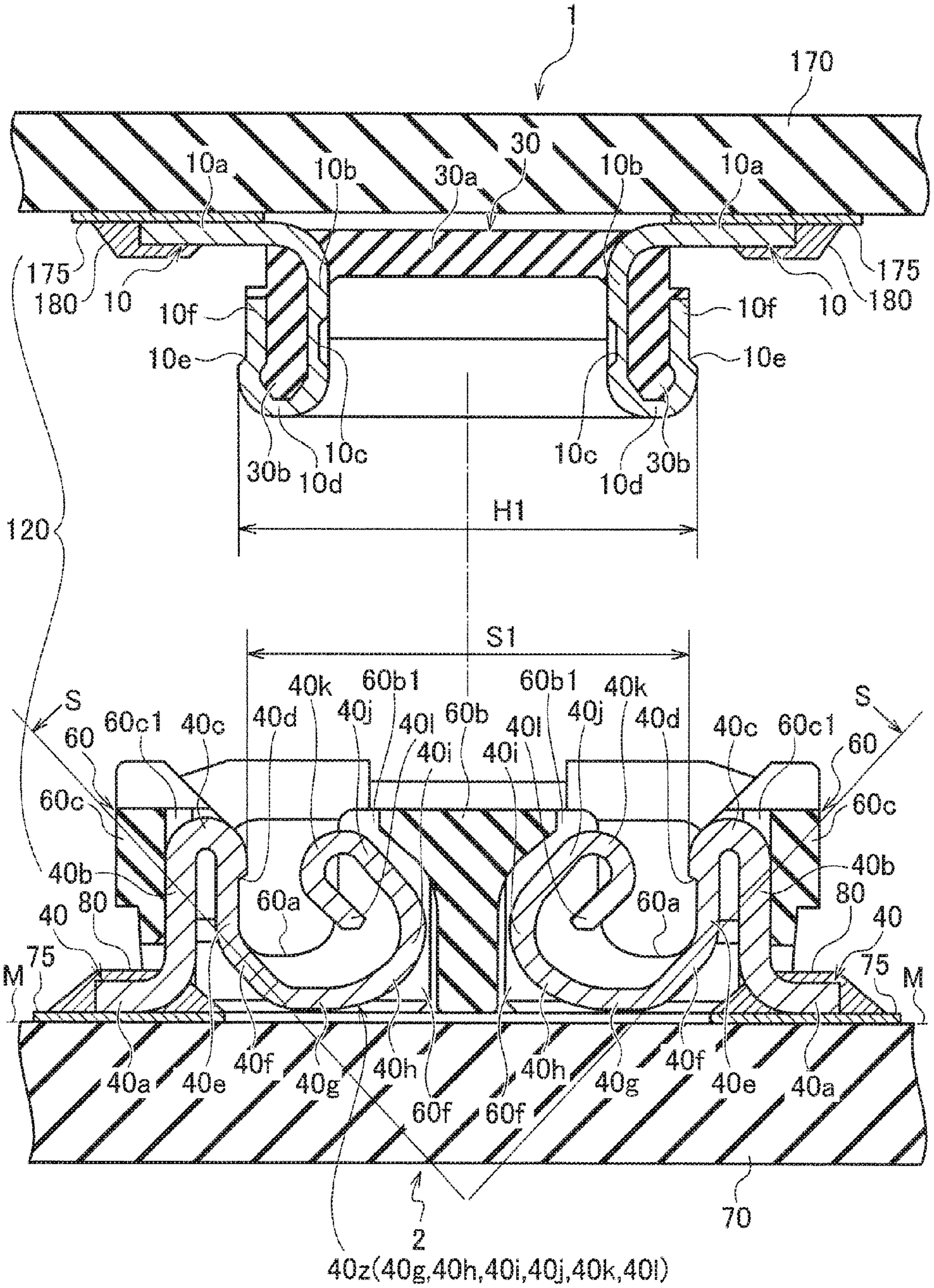
FIG. 5 is a diagram including: a cross-sectional view of the header taken along the V-V line of FIGS. 1 and 2; and a cross-sectional view of the socket taken along the V-V line of FIGS. 3 and 4.
Figure 6:
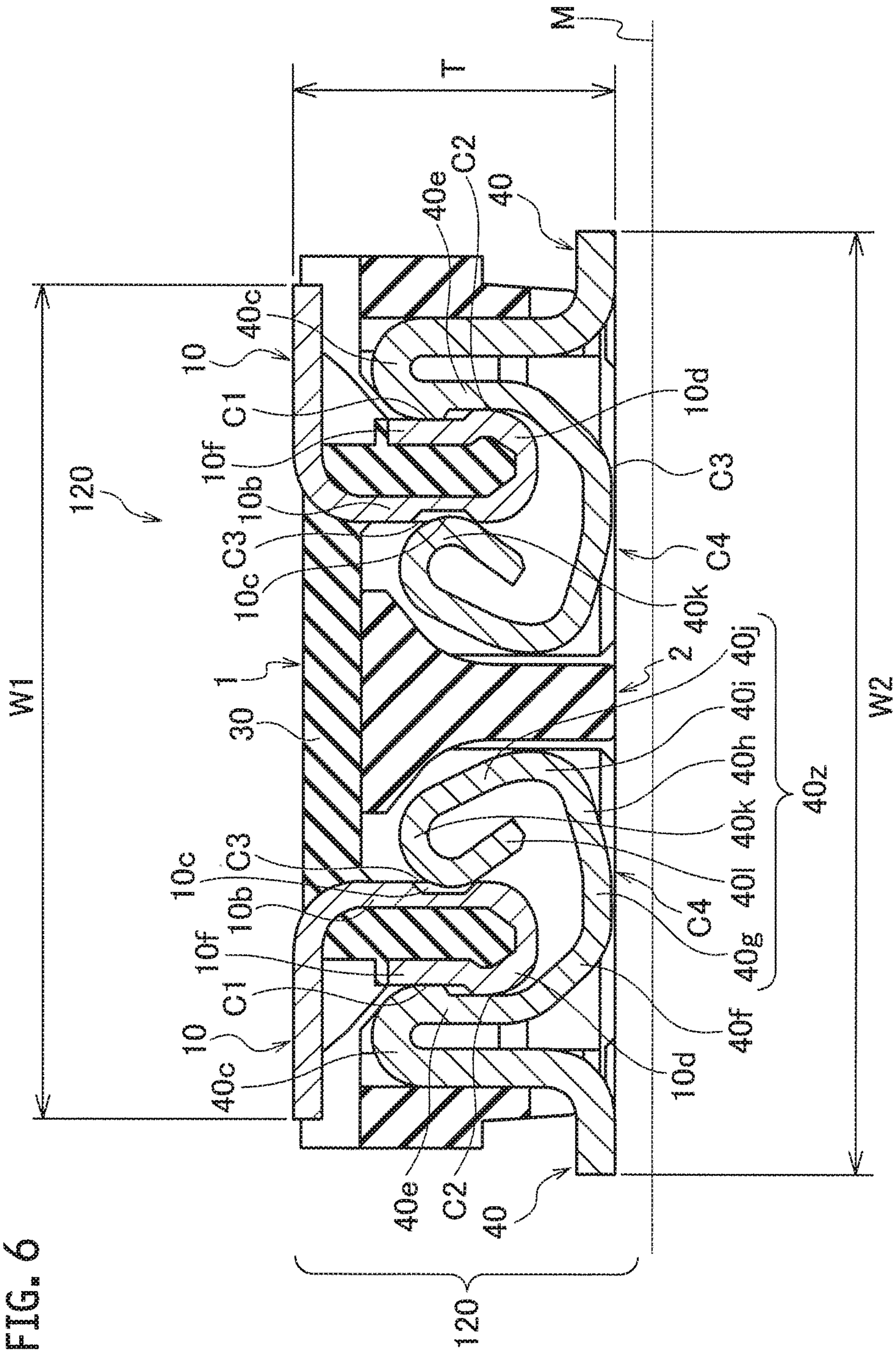
FIG. 6 is a diagram including: the cross-sectional view of the header taken along the V-V line of FIGS. 1 and 2; and the cross-sectional view of the socket taken along the V-V line of FIGS. 3 and 4.

Next, referring to FIGS. 5 and 6, detailed descriptions will be provided for the header 1 and the socket 2 in a connector 120 of the embodiment. In FIGS. 5 and 6, the header 1 and the socket 2 of the embodiment are fixed to a circuit board 70. However, the header and the socket of the present invention include ones which have not been fixed to the circuit board yet. Incidentally, when the header 1 and the socket 2 shown in FIG. 6 are fitted to each other, the thickness T of the connector 120 is 0.60 mm. Hereinafter, a direction specified by the thickness T in FIG. 6 will be referred to as a “thickness direction” of the connector.

FIGS. 5 and 6 show the header 1 fixed to a conductor wiring pattern 175 on a circuit board 170 using solder 180. Note that, as described above, the header 1 may be electrically connected to the FPC (Flexible Printed Circuit).

As learned from a cross-sectional view of the header 1 shown in FIG. 5, two header-side terminals 10 having the same shape are attached to the header housing 30 while facing each other. Meanwhile, as learned from a cross-sectional view of the socket 2 shown in FIG. 5, two socket-side terminals 40 having the same shape are similarly attached to the socket housing 60 while facing each other. Once the header 1 is fitted into the socket 2, the conductive header-side terminals 10 come into contact with the conductive socket-side terminals 40, as shown in FIG. 6. This creates a state in which electricity flows between the header-side terminals 10 and the socket-side terminals 40. In other words, the header 1 and the socket 2 are electrically connected together.

Next, referring to FIGS. 5 and 6, descriptions will be provided for the header-side terminals 10.

Each header-side terminal 10 includes a protrusion 10*a* projecting from the front surface or rear surface (in FIGS. 5 and 6, a side surface) of the header housing 30. The protrusion 10*a* is fixed to the conductor wiring pattern 175 on the circuit board 170 using the solder 180. Note that, the header of the present invention includes the protrusion 10*a* which, albeit currently not fixed to any member, is designed to be fixed to the conductor wiring pattern 175. As learned from FIG. 5, the upper surface of the protrusion 10*a* extends in parallel with the upper surface of the header housing 30, or the outer surface of the bottom surface portion 30*a*.

The header-side terminal 10 includes an inner side portion 10*b* continuing to the protrusion 10*a*. The inner side portion 10*b* penetrates, while curving, the joining portion where the bottom surface portion 30*a* and the edge portion 30*b* of the header housing 30 are joined together. The inner side portion 10*b* subsequently extends along the inner surface of the edge portion 30*b* to the tip end portion of the edge portion 30*b*.

The header-side terminal 10 includes a V-shaped groove 10*c*, or a V-shaped notch, formed in the inner side surface of the inner side portion 10*b*. An arc-shaped protrusion 40*k*, which is described later, of the socket-side terminal 40 is fitted into the V-shaped groove 10*c*.

The header-side terminal 10 includes a tip end portion 10*d* continuing to one end of the inner side portion 10*b*. The tip end portion 10*d* curves along the shape of the tip end of the edge portion 30*b* of the header housing 30.

The header-side terminal 10 includes a locked portion 10*e* continuing to the tip end portion 10*d*. As learned from comparison between FIGS. 5 and 6, once the header-side terminal 10 is fitted into the socket-side terminal 40, the locked portion 10*e* is inserted deeper than a locking portion 40*d* as a step portion. For this reason, when the header-side terminal 10 is pulled out of the socket-side terminal 40, the locked portion 10*e* comes into contact with the locking portion 40*d*. In other words, the locked portion 10*e* of the header-side terminal 10 is locked by the locking portion 40*d* of the socket-side terminal 40. Thereby, the header-side terminal 10 is inhibited from being pulled out of the socket-side terminal 40. To put it concretely, the header-side terminal 10 cannot be pulled out of the socket-side terminal 40 by mere application of external force less than a predetermined value. On the other hand, the header-side terminal 10 can be pulled out of the socket-side terminal 40 by application of external force equal to or greater than the predetermined value. In other words, the locked portion 10*e* of the header-side terminal 10 and the locking portion 40*d* of the socket-side terminal 40 form a lock mechanism in which the locked portion 10*e* and the locking portion 40*d* can be unlocked from each other by the application of external force equal to or greater than the predetermined value.

The header-side terminal 10 further includes an outer side portion 10*f* continuing to the tip end portion 10*d* via the locked portion 10*e*, and extending along the outer surface of the edge portion 30*b*.

Next, referring to FIGS. 5 and 6, descriptions will be provided for the socket-side terminals 40.

Each socket-side terminal 40 includes a root portion 40*a* projecting from the front surface or rear surface (in FIGS. 5 and 6, a side surface) of the socket housing 60. The root portion 40*a* is fixed to a conductor wiring pattern 75 on the circuit board 70 using solder 80. Note that, the socket of the present invention includes the root portion 40*a* which, albeit currently not fixed to any member, is designed to be fixed to the conductor wiring pattern 75. The lower surface of the root portion 40*a* extends along a principal surface M of the circuit board 70, and is placed on the same plane as the bottom surface of the socket housing 60 is.

The socket-side terminal 40 includes a rising portion 40*b* rising from the root portion 40*a*, and extending to become away from the circuit board 70. After curving from the root portion 40*a*, the rising portion 40*b* enters the cut portion 60*c*1, and extends along the inner surface of the edge portion 60*c*.

The socket-side terminal 40 includes an inverted U-shaped portion 40*c* whose one end continues to the upper end of the rising portion 40*b*. The inverted U-shaped portion 40*c* is shaped like the upside-down-placed letter U.

The socket-side terminal 40 includes the locking portion 40*d* continuing to the opposite end of the inverted U-shaped portion 40*c*. As described above, the locking portion 40*d* functions as the component configured to inhibit the movement of the locked portion 10*e* when the header-side terminal 10 is to be pulled out of the socket-side terminal 40. In other words, the locking portion 40*d* of the socket-side terminal 40 can lock the locked portion 10*e* of the header-side terminal 10 by coming into contact with the locked portion 10*e*. The locking portion 40*d* of the socket-side terminal 40 and the locked portion 10*e* of the header-side terminal 10 form the lock mechanism in which the lock can be unlocked from each other by the application of external force equal to or greater than the predetermined value.

The locking portion 40*d* may be produced by rolling a base material which makes parts of the socket-side terminal 40 different from each other in terms of thickness. Otherwise, the locking portion 40*d* may be produced by bending the base material of the socket-side terminal 40 in the thickness direction.

The socket-side terminal 40 includes a falling portion 40*e* continuing to the locking portion 40*d*, and extending almost in parallel with the rising portion 40*b*.

The socket-side terminal 40 includes an inclined portion 40*f* continuing to the lower end of the falling portion 40*e*. The inclined portion 40*f* is inclined to the principal surface M of the circuit board 70 in such a way as to become farther from the rising portion 40*b* as extending toward the principal surface M from the lower end of the falling portion 40*e*. To put it concretely, the inclined portion 40*f* extends along an inclined plane S which intersects the principal surface M of the circuit board 70 at a predetermined angle. Thus, the inclined portion 40*f* is placed away from the solder 80 by a predetermined distance.

As shown in FIG. 6, the socket-side terminal 40 includes a facing portion 40*z* continuing to the inclined portion 40*f*. The facing portion 40*z* includes a flat portion 40*g*, a first oblique portion 40*h*, an arc-shaped portion 40*i*, a second oblique portion 40*j*, the arc-shaped protrusion 40*k*, and a tip end portion 40*l*, which will be described below. Concretely, the facing portion 40*z* is as follows.

The facing portion 40*z* includes the flat portion 40*g* continuing to the lower end of the inclined portion 40*f*. As shown in FIG. 5, the flat portion 40*g* extends along the principal surface M of the circuit board 70 in such a way as to become farther from the falling portion 40*e*. The flat portion 40*g*, however, does not have to be in parallel with the principal surface M. The flat portion 40*g* is provided in order to increase the length of a spring portion, which will be described later.

As shown in FIG. 6, the facing portion 40*z* includes the first oblique portion 40*h* continuing to the flat portion 40*g*, and extending in a direction inclined to the principal surface M of the circuit board 70. The first oblique portion 40*h* extends in such a way as to become farther from the falling portion 40*e* as becoming farther from the circuit board 70. The first oblique portion 40*h* continues to the arc-shaped portion 40*i*. The arc-shaped portion 40*i* is a curving portion projecting in such a way as to become farther from the falling portion 40*e*. The arc-shaped portion 40*i* continues to the second oblique portion 40*j* extending in a direction inclined to the principal surface M of the circuit board 70. The second oblique portion 40*j* extends in such a way as to become closer to the falling portion 40*e* as becoming farther from the circuit board 70. Thus, the second oblique portion 40*j* is placed above the first oblique portion 40*h*.

As shown in FIG. 6, the facing portion 40*z* includes the arc-shaped protrusion 40*k* whose one end continues to the upper end of the second oblique portion 40*j*. As shown in FIG. 6, the arc-shaped protrusion 40*k* is fitted into the V-shaped groove 10*c* of the header-side terminal 10. The opposite end of the arc-shaped protrusion 40*k* continues to the tip end portion 40*l*. The tip end portion 40*l* extends almost in parallel with the second oblique portion 40*j*. As learned from FIGS. 5 and 6, the facing portion 40*z* (40*g*, 40*h*, 40*i*, 40*j*, 40*k*, 40*l*) continues to the inclined portion 40*f*, and as a whole, faces the falling portion 40*e*.

In the embodiment, when the header 1 and the socket 2 are fitted together, the header-side terminal 10 is inserted between the inverted U-shaped portion 40*c* and the arc-shaped protrusion 40*k*, as shown in FIG. 6. At this time, the falling portion 40*e*, the inclined portion 40*f*, the flat portion 40*g*, the first oblique portion 40*h*, the arc-shaped portion 40*i*, the second oblique portion 40*j*, the arc-shaped protrusion 40*k* and the tip end portion 40*l* integrally function as the spring portion. The spring portion (40*e*, 40*f*, 40*g*, 40*h*, 40*i*, 40*j*, 40*k*, 40*l*) is elastically deformed, once the projecting portion of the header-side terminal 10 is inserted into the recessed portion of the socket-side terminal 40. Thus, the distance between the arc-shaped protrusion 40*k* and the two portions including the falling portion 40*e* and the inverted U-shaped portion 40*c* becomes longer. At this time, the locked portion 10*e* of the header-side terminal 10 is inserted lower than the locking portion 40*d* of the socket-side terminal 40. Thereby, the arc-shaped protrusion 40*k* of the socket-side terminal 40 is fitted into the V-shaped groove 10*c* of the header-side terminal 10.

While the header-side terminal 10 is being fitted in the socket-side terminal 40, the elastically-deformed spring portion produces resilience. This resilience makes the arc-shaped protrusion 40*k* press the header-side terminal 10 against each of the falling portion 40*e* and the inverted U-shaped portion 40*c*. Thereby, the header-side terminal 10 is held by the socket-side terminal 40. At this time, the header-side terminal 10 comes into contact with each of the falling portion 40*e* and the arc-shaped protrusion 40*k*.

To put it concretely, as shown in FIG. 6, the outer side portion 10*f* of the header-side terminal 10 comes into contact with the inverted U-shaped portion 40*c* of the socket-side terminal 40 at a contact point C1. The tip end portion 10*d* of the header-side terminal 10 comes into contact with the falling portion 40*e* of the socket-side terminal 40 at a contact point C2. In addition, the V-shaped groove 10*c* of the header-side terminal 10 comes into contact with the arc-shaped protrusion 40*k* of the socket-side terminal 40 at a contact point C3. In sum, the header-side terminal 10 comes into contact with the socket-side terminal 40 at the plurality of contact points. For this reason, the electrical connection between the header-side terminal 10 and the socket-side terminal 40 is highly reliable. Incidentally, the elastic deformation of the spring portion may make the boundary portion between the flat portion 40*g* and the first oblique portion 40*h* come into contact with the circuit board 70 at a contact point C4 in addition to the contact points C1, C2, and C3.

The header-side terminal 10 and the socket-side terminal 40 of the embodiment come into contact with each other at the plurality of contact points. Instead, however, the header-side terminal and the socket-side terminal of the present invention may be configured to come into contact with each other at a single contact point between the inner side surface of the header-side terminal and the facing portion of the socket-side terminal.

Figure 7:
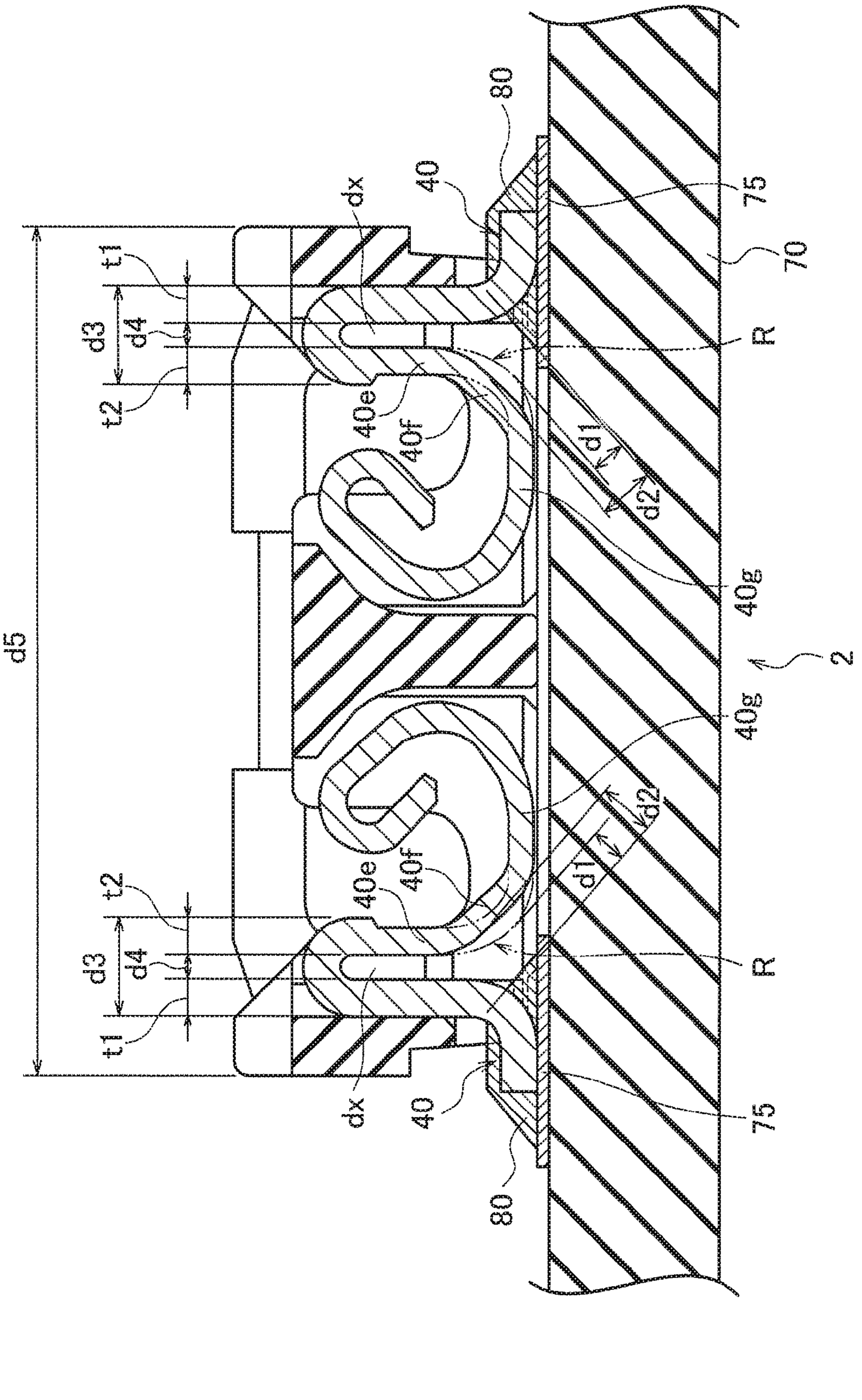
FIG. 7 is a cross-sectional view of the socket and a circuit board for comparing socket-side terminals of the embodiment of the present invention and socket-side terminals of a first comparative example.

Next, using FIG. 7, the inclined portion of the embodiment of the present invention will be compared with an arc-shaped portion R of the inclined portion 40*f* as a comparative example.

As described above, in the socket 2 of the embodiment, the inclined portion 40*f* represented by solid lines in FIG. 7 continues to each of the falling portion 40*e* and the flat portion 40*g*. On the other hand, in a socket of the comparative example, instead of the inclined portion 40*f*, the arc-shaped portion R represented by imaginary lines in FIG. 7 continues to each of the falling portion 40*e* and the flat portion 40*g*. The comparison between the inclined portion 40*f* and the arc-shaped portion R shows that a distance d2 between the inclined portion 40*f* of the embodiment and the solder 80 is greater than a distance d between the arc-shaped portion R of the comparative example and the solder 80. For this reason, the inclined portion 40*f* of the embodiment makes the solder 80, while melt, less likely to adhere to the portions of the socket-side terminal 40 except for the root portion 40*a* than the arc-shaped portion R of the comparative example. As a result, even if a distance d4 between the rising portion 40*b* and the falling portion 40*e* is decreased, or even if a distance d3 between the outer side surface of the rising portion 40*b* and the inner side surface of the inverted U-shaped portion 40*c*, the solder 80, while melt, is less likely to adhere to the inclined portion 40*f*. Accordingly, the inclined portion 40*f* of the embodiment reduces the likelihood that the function of the spring portion (40*e*, 40*f*, 40*g*, 40*h*, 40*i*, 40*j*, 40*k*, 40*l*) deteriorates due to the adhering of the solder 80.

As learned from the above, the inclined portion 40*f* of the embodiment can make a width dimension W2 (the width dimension W2 in FIGS. 3 and 6) or a dimension d5 (see FIG. 7) of the socket smaller than the arc-shaped portion R does. For this reason, the width dimension of the connector 120 can be reduced.

In the socket-side terminal 40 of the embodiment, the distance d4 between the rising portion 40*b* and the falling portion 40*e* is less than the thickness of the base material of the socket-side terminal 40. In other words, the width of a gap dx is less than both a thickness t1 of the one end and a thickness t2 of the opposite end of the inverted U-shaped portion 40*c*. The thickness of the base material means the thickness of the plate-shaped material before processing the socket-side terminal 40 from the plate-shaped material.

Figure 8:
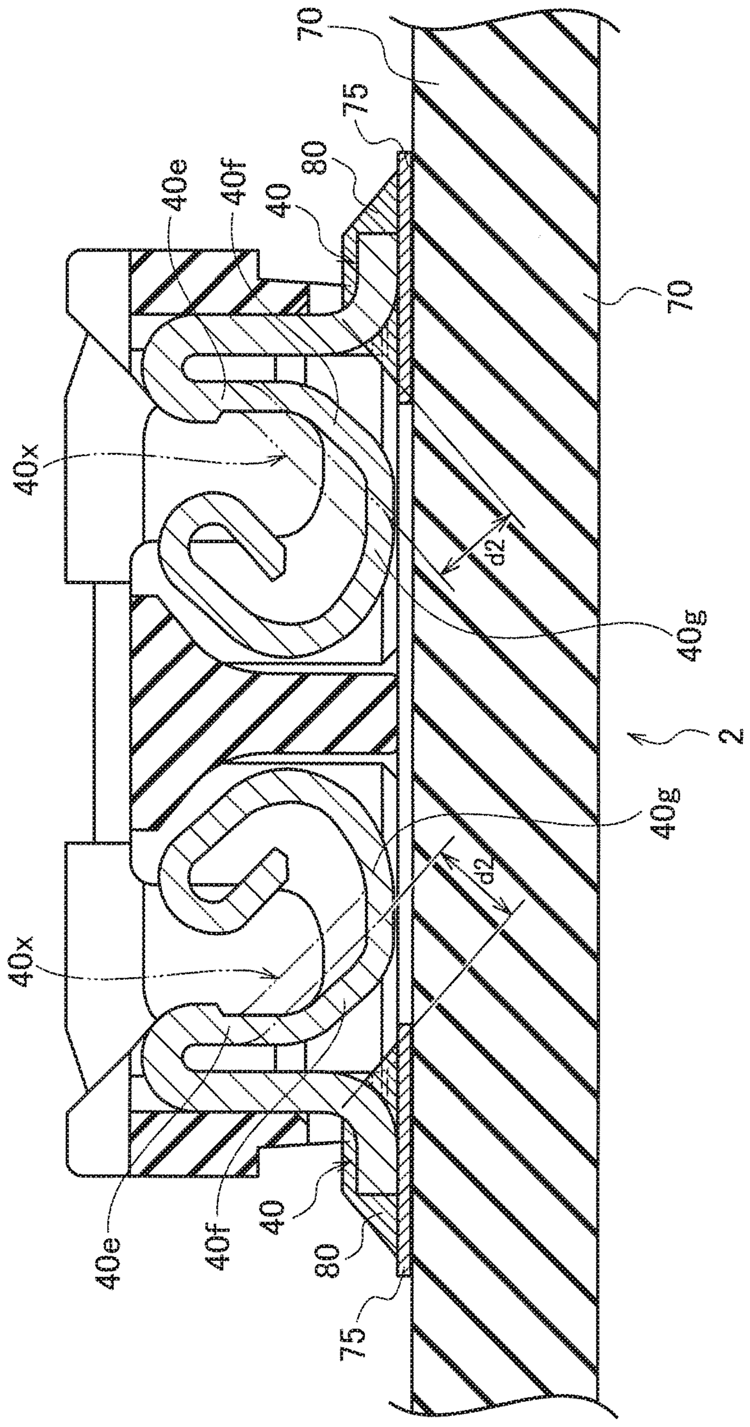
FIG. 8 is a cross-sectional view of the socket and the circuit board for comparing the socket-side terminals of the embodiment of the present invention and socket-side terminals of a second comparative example.

The following should be noted. If as shown in FIG. 8, a long inclined portion 40*x* were provided to the socket-side terminal 40, the distance d2 between the inclined portion 40*x* and the solder 80 would be able to be increased very much. However, the falling portion 40*e* and the flat portion 40*g* would be shortened very much. For this reason, the spring length of the spring portion (40*e*, 40*f*, 40*g*, 40*h*, 40*i*, 40*j*, 40*k*, 40*l*) would be decreased. Furthermore, the space which receives the header-side terminal 10 would become smaller.

It is desirable that the inclined portion 40*f* be formed from a flat portion forming a part interposed between the two parallel flat surfaces. The reason for this is that when the inclined portion **40*f* is such a flat portion, the structure of the inclined portion 40*f* can be simplified, and the distance d2 between the inclined portion 40*f* and the solder 80** can be increased as much as possible.

Figure 9:
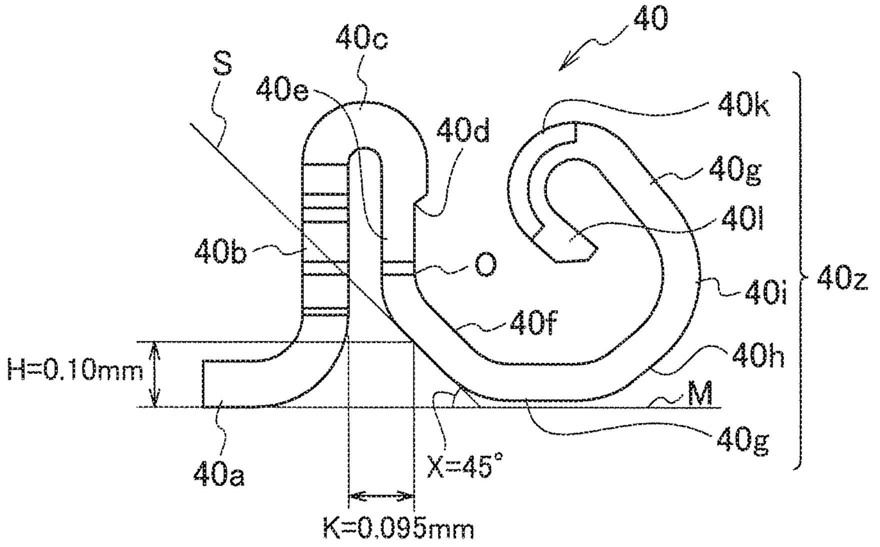
FIG. 9 is a front view of a socket-side terminal of a first example of the embodiment of the present invention.
Figure 10:
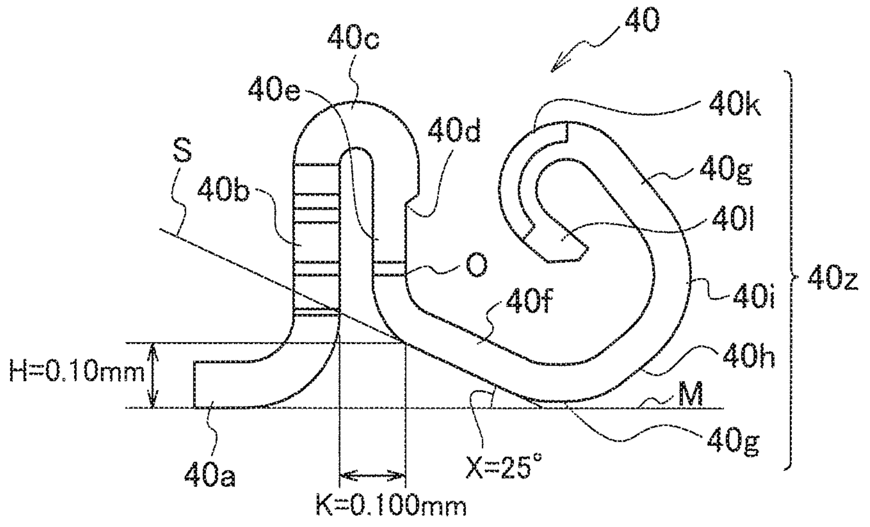
FIG. 10 is a front view of a socket-side terminal of a second example of the embodiment of the present invention.
Figure 11:
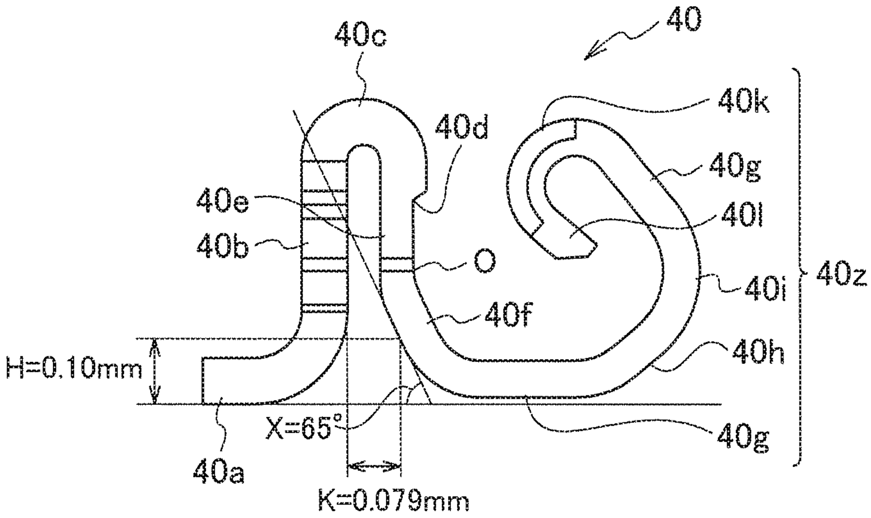
FIG. 11 is a front view of a socket-side terminal of a third example of the embodiment of the present invention.
Figure 12:
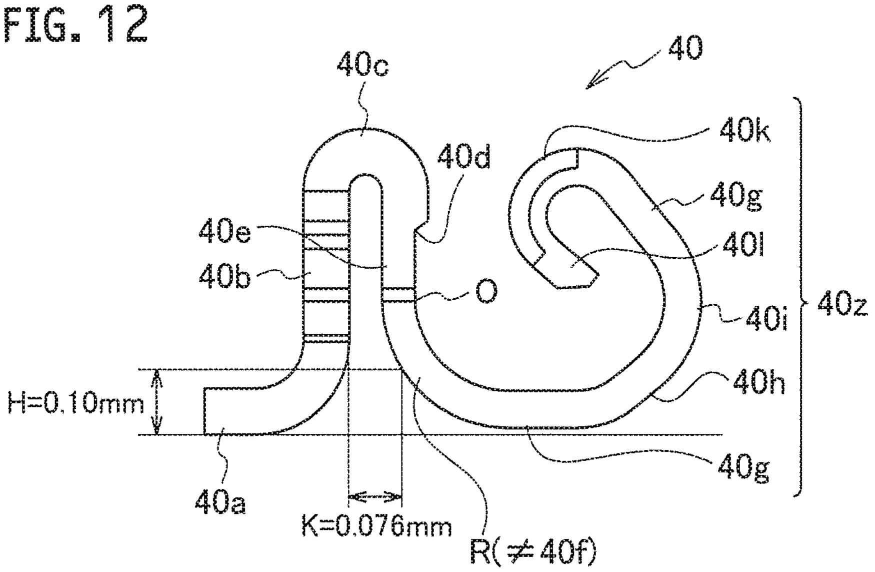
FIG. 12 is a front view of a socket-side terminal of a comparative example of the embodiment of the present invention.

It is desirable that as shown in FIGS. 9 to 11, an angle of inclination of an inclined plane S of the inclined portion **40*f* of the embodiment to the principal surface M of the circuit board 70 be within a range of approximately 250 to approximately 650. The reason for this is that the distance from the solder 80 to the inclined portion 40*f* can be made greater than the distance from the solder 80 to the arc-shaped portion R (see FIG. 7) of the comparative example shown in FIG. 12**. More detailed descriptions will be provided for this as follows.

Reference sign K denotes the distance from the inner side surface of the rising portion **40*b* to the inclined plane S (or a corresponding part of the arc-shaped portion R) at a position at the height of H=0.10 mm above the principal surface M of the circuit board 70, that is to say, at a position of the upper surface of the thickness of a generally-used solder mask. The distances K in the cases of the inclined portions 40*f* shown in FIGS. 9 to 11 is compared with the distance K in the case of the arc-shaped portion R shown in FIG. 12. Incidentally, the positions of points O shown in FIGS. 9 to 11 represent the position of a start point O of the arc of the arc-shaped portion R shown in FIG. 12**.

FIG. 9 is a diagram showing the socket-side terminal 40 which makes an angle X of the inclined plane S to the principal surface M of the circuit board 70 equal to 45°. The distance K in the case of the inclined portion **40*f* shown in FIG. 9 is 0.095 mm, and is greater than 0.076 mm which is the distance K in the case of the arc-shaped portion R of the comparative example shown in FIG. 12**.

FIG. 10 is a diagram showing the socket-side terminal 40 which makes the angle X of the inclined plane S to the principal surface M of the circuit board 70 equal to 25°. The distance K in the case of the inclined portion **40*f* shown in FIG. 10 is 0.100 mm, and is greater than 0.076 mm which is the distance K in the case of the arc-shaped portion R of the comparative example shown in FIG. 12**.

FIG. 11 is a diagram showing the socket-side terminal 40 which makes the angle X of the inclined plane S to the principal surface M of the circuit board 70 equal to 65°. The distance K in the case of the inclined portion **40*f* shown in FIG. 11 is 0.079 mm, and is greater than 0.076 mm which is the distance K in the case of the arc-shaped portion R of the comparative example shown in FIG. 12**.

As learned from the above, when the angles X shown in FIGS. 9 to 11 are increased too much, the distances K in the case of the inclined portions **40*f* become smaller than the distance K in the case of the arc-shaped portion R, and therefore, the solder 80 is more likely to adhere to the inclined portions 40*f*. As a result, the distance d3 between the outer side surface of the rising portion 40*b* and the inner side surface of the falling portion 40*e* (see FIG. 7) cannot be decreased, and therefore, the width dimension W2 of the socket-side terminal 40 (see FIGS. 3 and 6) cannot be decreased. For this reason, it is desirable that the angle X be not greater than 65°. On the other hand, when the angle X is reduced too much, the width dimension of the socket-side terminal 40 becomes larger. In this case, too, the width dimension W2 of the socket-side terminal 40 (see FIGS. 3 and 6) cannot be reduced. For this reason, it is desirable that the angle X be not less than approximately 25°. Note that, if the width dimension W2 of the socket-side terminal 40 (see FIGS. 3 and 6**) can be reduced, the angle X may be out of the range of 25° to 65°.

Figure 13:
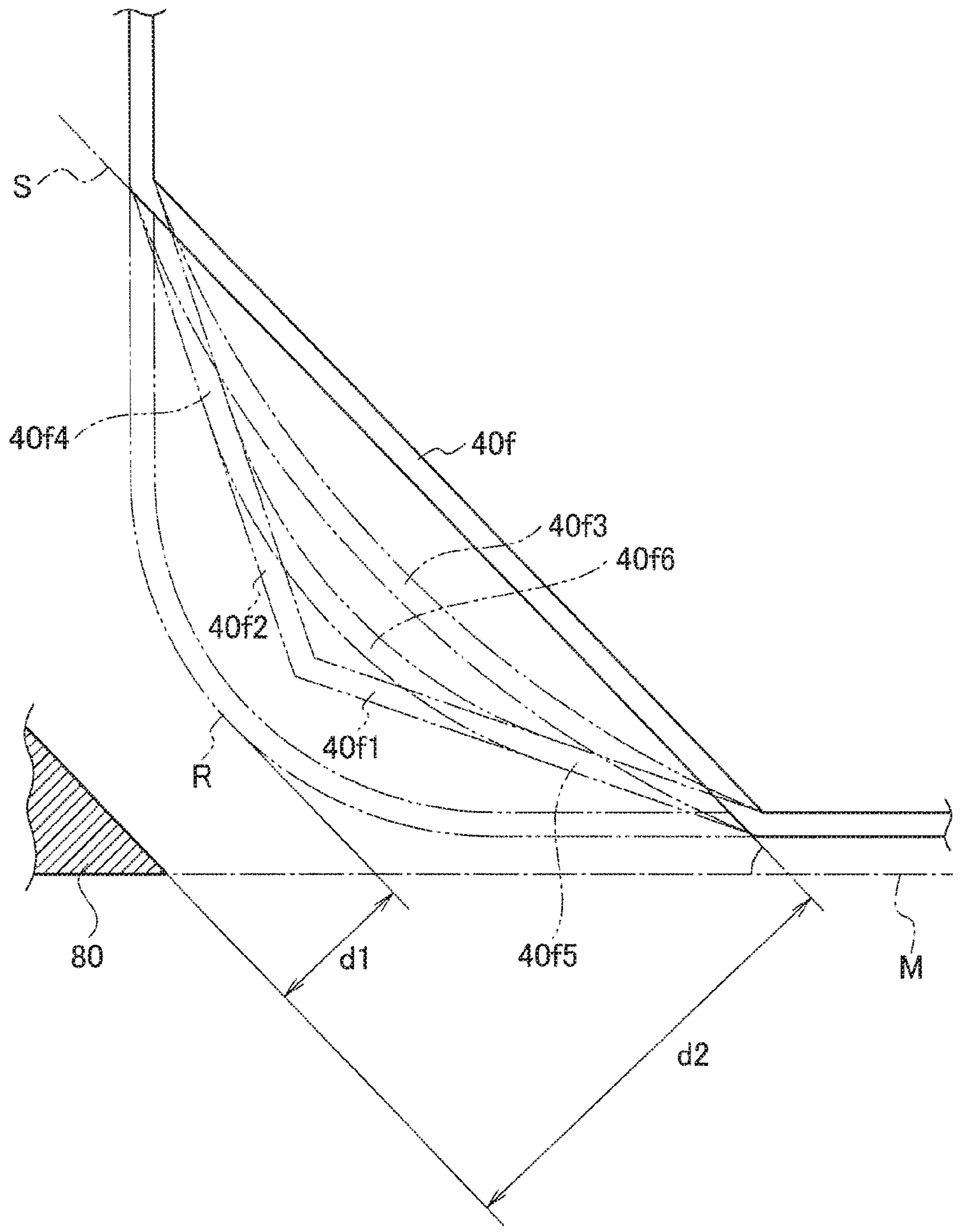
FIG. 13 is a diagram showing inclined portions of socket-side terminals of first, fourth, fifth and sixth examples of the embodiment of the present invention, and an arc-shaped portion of the socket-side terminal of the comparative example, for comparison purposes.

Referring to the FIG. 13, descriptions will be provided for inclined portions of the present invention which are not the inclined portions **40*f* of the embodiment. To this end, the arc-shaped portion R of the comparative example which continues to the falling portion 40*e* and the flat portion 40*g* is considered. It is supposed that the arc-shaped portion R of the comparative example is inclined from the falling portion 40*e* through the arc-shaped portion R to the flat portion 40*g***, that is to say, the tangent of the arc-shaped portion R continuously changes.

The inclined portions **40*f* shown in FIGS. 9 to 11 are the flat portions extending from the lower end of the falling portion 40*e*** along the inclined plane S. Note that, the inclined portion of the present invention may take on any shape, as long as the inclined portion as a whole extends along the inclined plane S to the principal surface M. In other words, as long as the start point and end point of the inclined plane S lie in the inclined plane S, the inclined portion of the present invention may include a protrusion, which does not lie in the inclined plane S, between the start point and end point of the inclined plane S. However, from a viewpoint of preventing the solder from adhering to the inclined portion, the present invention requires that the distance from the solder to the inclined portion be greater than the distance from the solder to the arc-shaped portion R in the aforementioned comparative example.

Furthermore, with regard to the inclined portion of the present invention, its projection toward the solder is more desirable than its projection in such a way as to become farther from the solder. The reason for this is that in the case where the inclined portion projects in such a way as to become farther from the solder, there is likelihood that the space which receives the header-side terminal 10 cannot be left. Note that, as long as the space which receives the header-side terminal 10 can be left, even the inclined portion projecting in such a way as to become farther from the solder 80 is also included in the inclined portion of the present invention. This is because even the inclined portion projecting in such a way as to become farther from the solder 80 also can achieve the object of the present invention, that is to say, the prevention of the solder from adhering to the inclined portion, as long as the inclined portion as a whole extends along the inclined plane.

Descriptions will be hereinbelow provided for examples of the shape of the inclined portion of the present invention which is not the inclined portion formed from the flat portion.

The inclined portion of the present invention may include one or more bending portions projecting toward the solder. In this case, the inclined portion of the present invention is formed by combining plurality of flat portions which continue via one or more bending portions. For example, as shown in FIG. 13, the combination of the plurality of bending portions as the inclined portion of the present invention may be a combination of flat portions **40*f*1, 40*f*2 provided with a bending portion interposed in between in such a way that the bending portion projects toward the solder 80. Any combination may be employed as the combination of the plurality of flat portions forming the inclined portion of the present invention, as long as the plurality of flat portions in combination are placed farther from the solder 80 than the arc-shaped portion R of the comparative example is. The reason for this is that as long as the plurality of flat portions in combination are placed farther from the solder 80 than the arc-shaped portion R of the comparative example is, it is possible to obtain an effect of inhibiting the solder 80** from adhering to the plurality of flat portions in combination.

The inclined portion of the present invention may be a curving portion projecting toward the solder 80. In this case, the curving portion forming the inclined portion of the present invention may take on any shape, as long as the curving portion as a whole extends along the inclined plane S joining the lower end of the falling portion 40*e* and the end portion of the flat portion 40*g*. Incidentally, the "curving portion as a whole extends along the inclined plane S" means that although no part of the curving portion between the start point and the end point of the curving portion lies in the inclined plane S, the start point and the end point of the curving portions lie in the inclined plane S. The inclined portion f the present invention may be a curving portion 40*f*3 shown in FIG. 13, for example. Note that, in order for the curving portion 4013 to reduce more of the likelihood that the solder 80 adheres to the curving portion 40*f*3 than the arc-shaped portion does, the curving portion 40*f*3 needs to have a curvature radius which is larger than that of the arc-shaped portion R. In other words, the distance from the solder 80 to the curving portion 40*f*3 needs to be larger than the distance d1 from the solder 80 to the arc-shaped portion R.

Furthermore, the inclined portion of the present invention may take on any other shape than the foregoing shapes, as long as the inclined portion is provided at a position which is farther from the solder 80 than the position of the arc-shaped portion R is. For example, the inclined portion of the present invention may be formed from a combination of differently-shaped portions. For example, as shown in FIG. 13, the combination of differently-shaped portions may be a combination of three portions, that is to say, two flat portions 40*f*4, 40*f*5 and a curving portion 40*f*6 provided between the two flat portions 40*f*4, 40*f*5. The combination of differently-shaped portions is not limited to the ones shown in FIG. 13. Any combination of differently-shaped portions may be employed as the inclined portion of the present invention, as long as the combination includes at least one flat portion and at least one curving portion. In this case, too, the inclined portion of the present invention may take on any shape, as long as the inclined portion as a whole extends along the inclined plane S joining the lower end of the falling portion 40*e* and the end portion of the flat portion 40*g*. With regard to the combination of differently-shaped portions, no part of the combination between the start point and the end point of the combination does have to lie in the inclined plane S, as long as: the combination projects toward the solder; and the start point and the end point of the combination lie in the inclined plane S.

In addition, it is desirable that the distance d4 between the rising portion 40*b* and the falling portion 40*e* shown in FIG. 7 be equal to or less than the thickness of the base material of the socket-side terminal 40 (before the process). To put it concretely, it is desirable that the distance d4 be equal to or less than the thickness t1 of the one end and the thickness t2 of the opposite end of the inverted U-shaped portion 40*c*. The use of this configuration makes it possible to reduce the width dimension W2 (see FIGS. 3 and 6) or the dimension d5 (see FIG. 7) of the socket to a large extent.

Next, referring to FIGS. 3, 4, 14, 15, 20 to 27, 28, 40 to 53, and 54, descriptions will be provided for the header-side retaining fittings 20 and the socket-side retaining fittings 50 of the embodiment.

To begin with, descriptions will be provided for the header-side retaining fittings 20.

As described above, each header-side retaining fitting 20 has the same shape as each header-side terminal 10. However, how to attach the header-side retaining fitting 20 to the header housing 30 is different from how to attach the header-side terminal 10 to the header housing 30.

As shown in FIGS. 14, 15, 20 to 27, and 28, each header-side retaining fitting 20 includes a protrusion 20*a* to be fixed to a conductor wiring pattern 375 on the circuit board 170 using solder 380. The protrusion 20*a* projects from the front surface or rear surface (in FIG. 14, a side surface) of the header housing 30 in a way that the upper surface of the protrusion 20*a* is placed flush with the upper surface of the header housing 30, or the outer surface of the bottom surface portion 30*a*.

As shown in FIGS. 14, 15, 20 to 27, and 28, the header-side retaining fitting 20 includes an inner side portion 20*b* continuing to the protrusion 20*a*. The inner side portion 20*b* penetrates, while curving, the joining portion where the bottom surface portion 30*a* and the edge portion 30*e* of the header housing 30 are joined together. Subsequently, the inner side portion 20*b* extends along the inner surface of the edge portion 30*e* to the tip end portion of the edge portion 30*e*. A V-shaped groove 20*c*, or a V-shaped notch, is provided to the inner side surface of the inner side portion 20*b*. Part of the resin forming the header housing 30 enters the V-shaped groove 20*c* of the header-side retaining fitting 20.

The header-side retaining fitting 20 includes a locked portion 20*e* continuing to a tip end portion 20*d*. As shown in FIGS. 14, 15, 20 to 27, and 28, once the header-side retaining fitting 20 is fitted into the socket-side retaining fitting 50, the locked portion 20*e* is inserted deeper than a locking piece portion 50*e*. For this reason, when the header-side retaining fitting 20 is pulled out of the socket-side retaining fitting 50, the locked portion 20*e* comes into contact with the locking piece portion 50*e*. In other words, the locked portion 20*e* of the header-side retaining fitting 20 is locked by the locking piece portion 50*e* of the socket-side retaining fitting 50. Thereby, the header-side retaining fitting 20 is inhibited from being pulled out of the socket-side retaining fitting 50. To put it concretely, the header-side retaining fitting 20 cannot be pulled out of the socket-side retaining fitting 50 by mere application of external force less than a predetermined value. On the other hand, the header-side retaining fitting 20 can be pulled out of the socket-side retaining fitting 50 by application of external force equal to or greater than the predetermined value. In sum, the locked portion 20*e* of the header-side retaining fitting 20 and the locking piece portion 50*e* of the socket-side retaining fitting 50 form a lock mechanism in which the locked portion 20*e* and the locking piece portion 50*e* can be unlocked from each other by the application of external force equal to or greater than the predetermined value.

The header-side retaining fitting 20 includes an outer side portion 20*f* continuing to the tip end portion 20*d* via the locked portion 20*e*, and extending along the outer surface of the edge portion 30*e*.

Next, descriptions will be provided for the socket-side retaining fittings 50.

As shown in FIGS. 3 and 4, each socket-side retaining fitting 50 includes a central portion 50*b* extending in the width direction, and covering the side surface of the socket housing 60. As shown in FIGS. 3 and 4, the socket-side retaining fitting 50 includes arm portions 50*c* extending from the central portion 50*b* to predetermined positions in such a way as to cover the parts of the front surface and rear surface of the socket housing 60. As shown in FIGS. 3, 4, 46 to 53, and 54, the socket-side retaining fitting 50 includes leg portions 50*a* extending from the central portion 50*b* to predetermined positions in such a way as to cover parts of the bottom surface of the socket housing 60. The leg portions 50*a* include portions extending from the central portion 50*b* along the bottom surface of the socket housing 60, and respectively projecting from the front surface and rear surface of the socket housing 60.

As shown in FIGS. 3, 4, 46 to 53, and 54, the socket-side retaining fitting 50 includes rising portions 50*d* extending from tip end portions of the arm portions 50*c* at predetermined positions in a thickness direction of the socket housing 60. The socket-side retaining fitting 50 includes the locking piece portions 50*e* curving from tip end portions of the rising portions 50*d* toward the rectangular plate-shaped inside.

Figure 14:
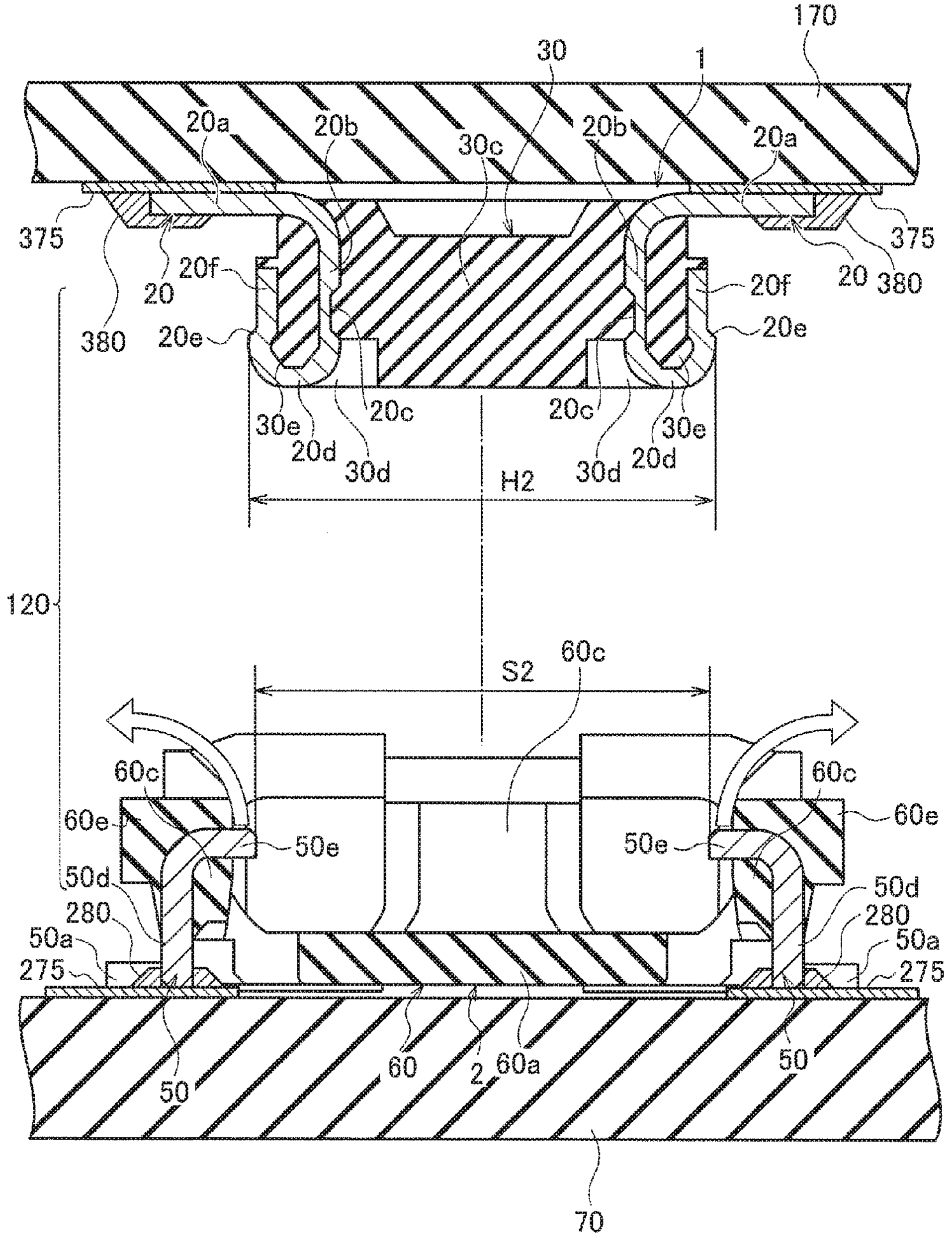
FIG. 14 is a diagram including: a cross-sectional view of the header taken along the XIV-XIV line of FIGS. 1 and 2; and a cross-sectional view of the socket taken along the XIV-XIV line of FIGS. 3 and 4.
Figure 15:
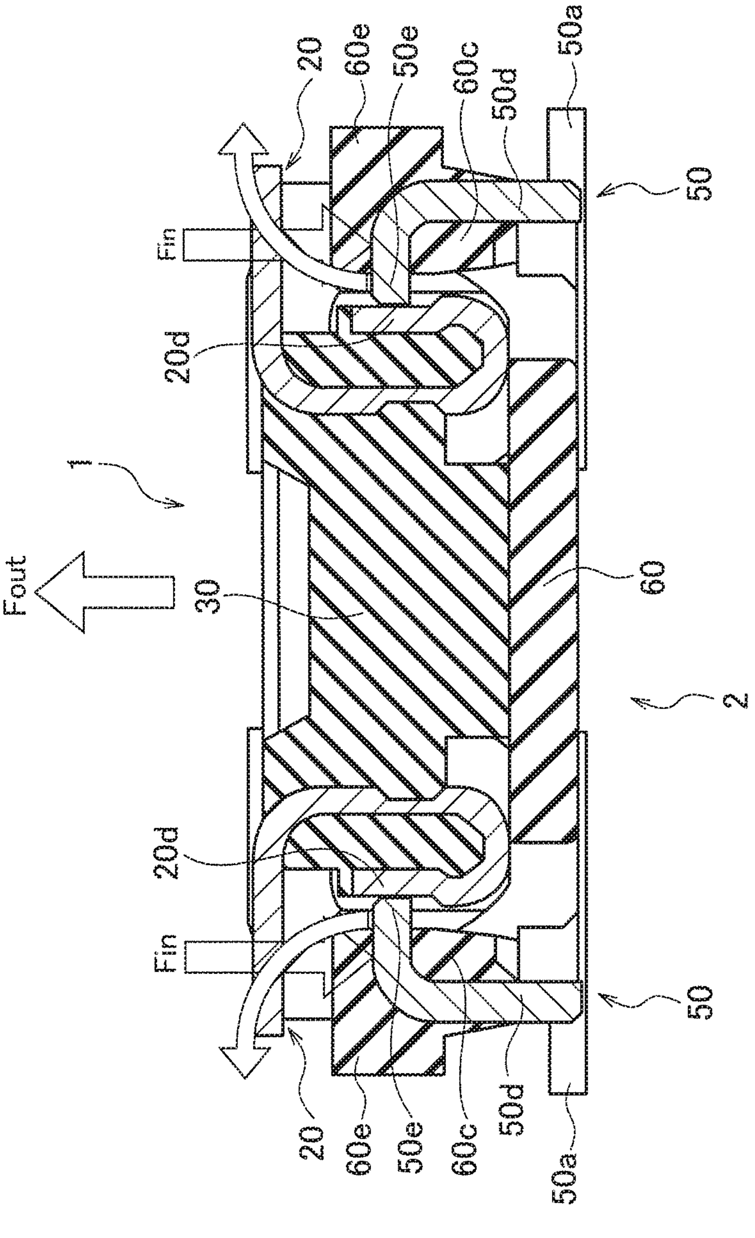
FIG. 15 is a diagram including: the cross-sectional view of the header taken along the XIV-XIV line of FIGS. 1 and 2; and the cross-sectional view of the socket taken along the XIV-XIV line of FIGS. 3 and 4.
Figure 16:
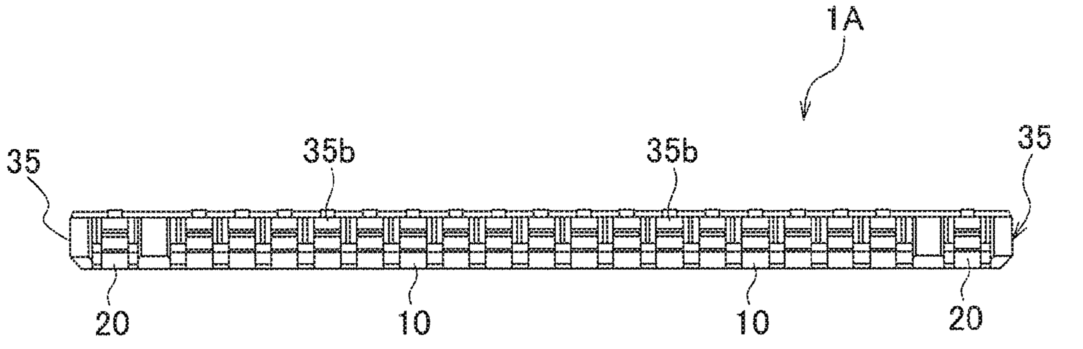
FIG. 16 is a front view of a header of a different example of the embodiment of the present invention.
Figure 17:
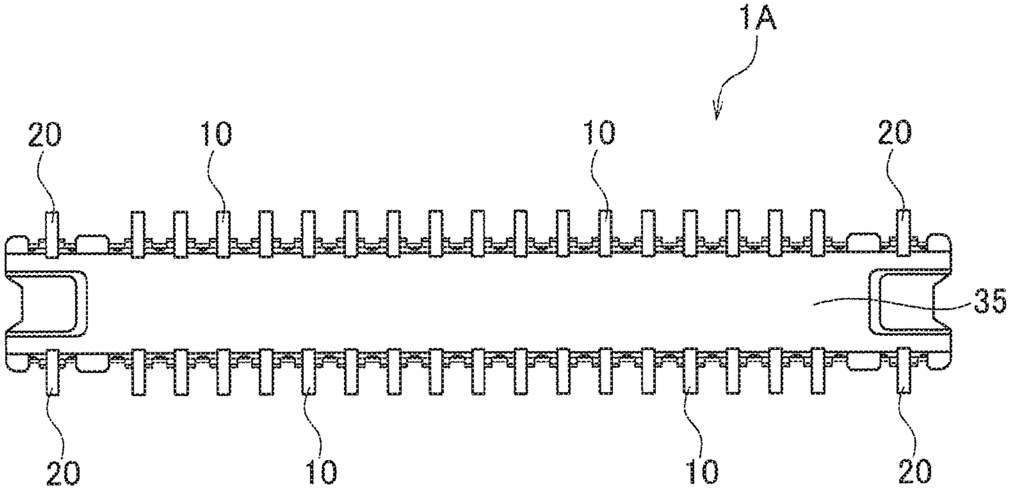
FIG. 17 is a plan view of the header of the different example of the embodiment of the present invention.
Figure 18:
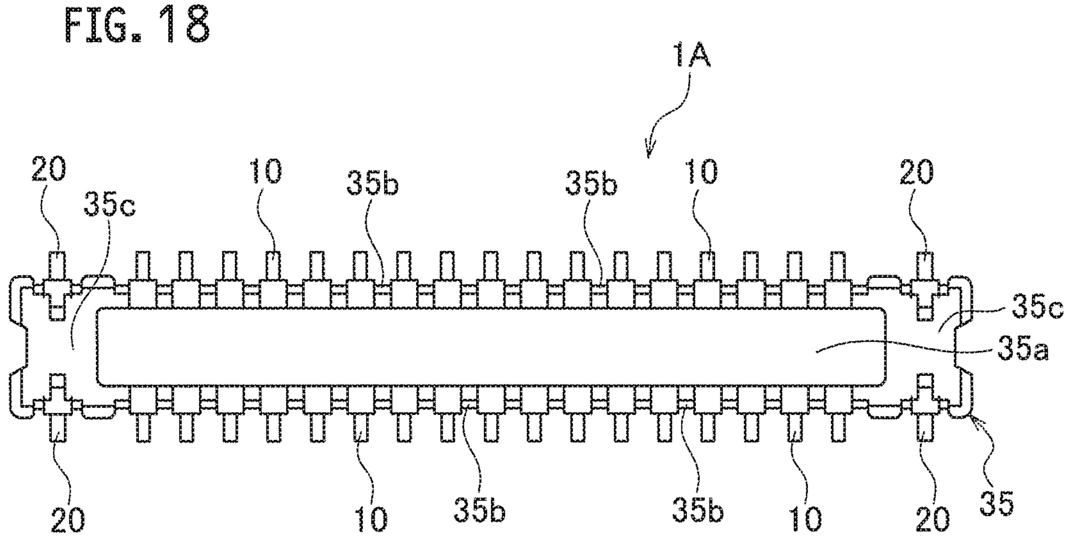
FIG. 18 is a bottom view of the header of the different example of the embodiment of the present invention.
Figure 19:
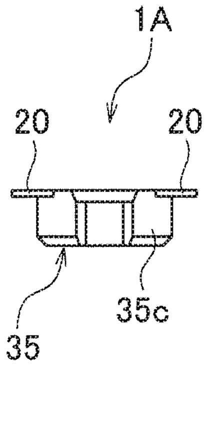
FIG. 19 is a side view of the header of the different example of the embodiment of the present invention.
Figure 20:
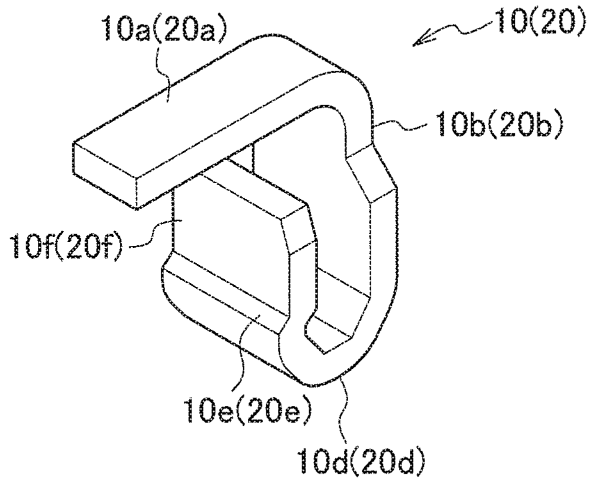
FIG. 20 is a first perspective view of a header-side terminal of the embodiment of the present invention.
Figure 21:
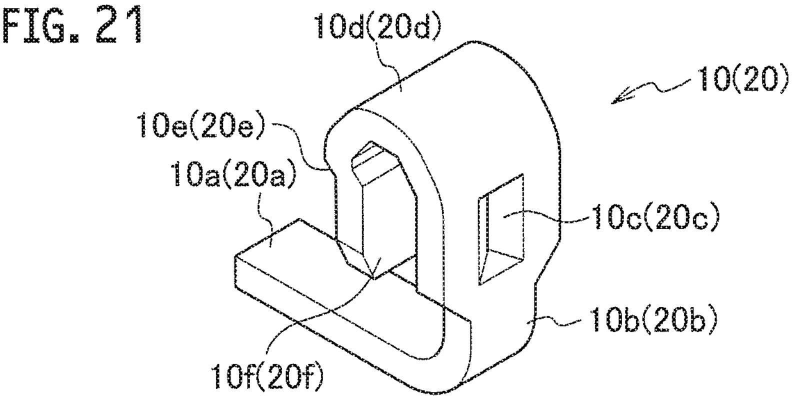
FIG. 21 is a second perspective view of the header-side terminal of the embodiment of the present invention.
Figure 22:
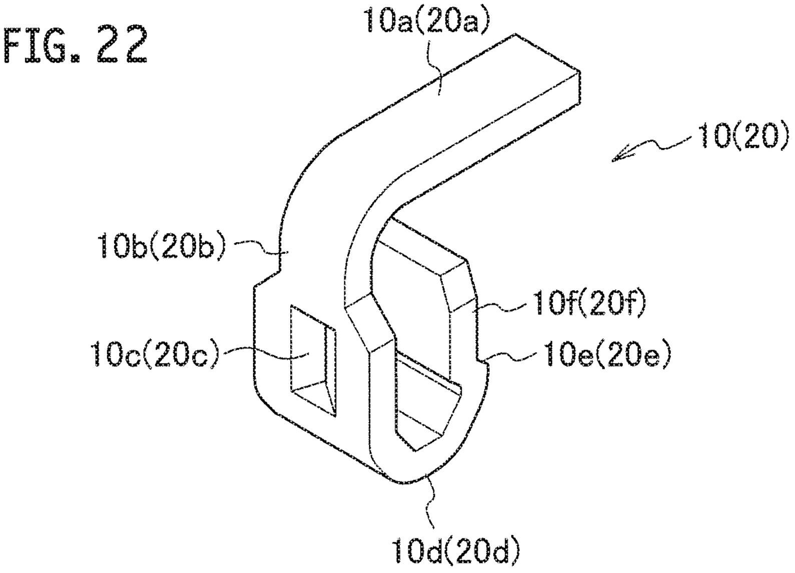
FIG. 22 is a third perspective view of the header-side terminal of the embodiment of the present invention.
Figure 23:
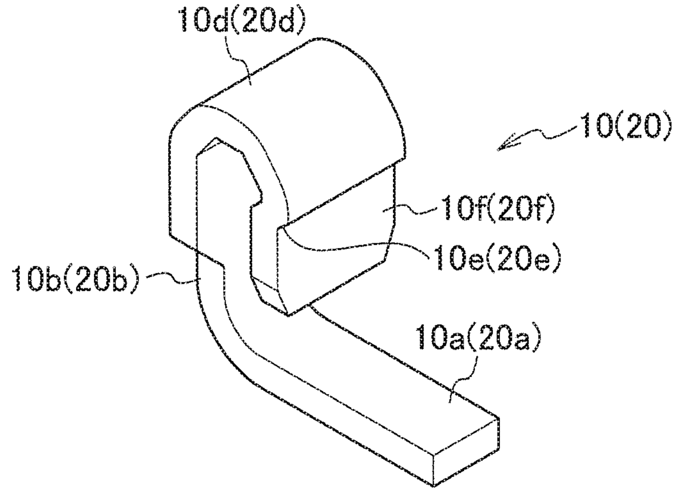
FIG. 23 is a fourth perspective view of the header-side terminal of the embodiment of the present invention.
Figure 24:
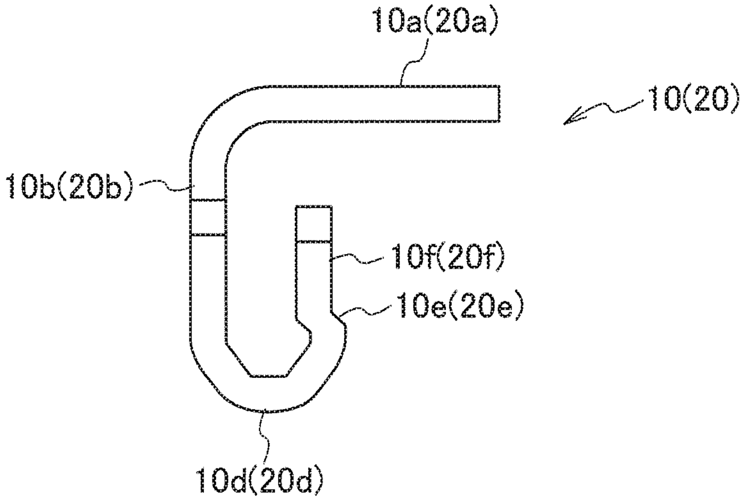
FIG. 24 is a front view of the header-side terminal of the embodiment of the present invention.
Figure 25:
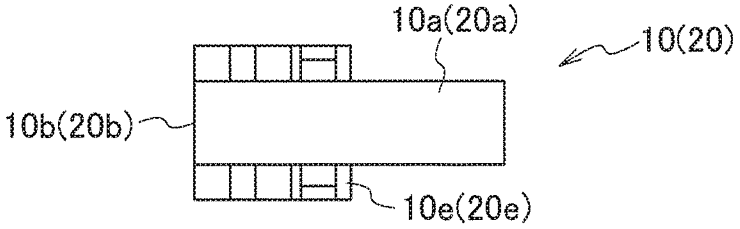
FIG. 25 is a plan view of the header-side terminal of the embodiment of the present invention.
Figure 26:
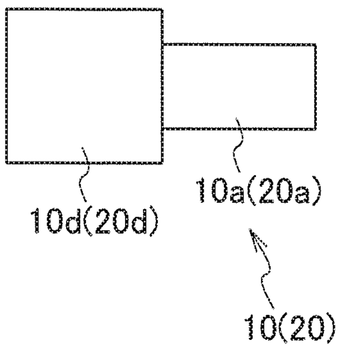
FIG. 26 is a bottom view of the header-side terminal of the embodiment of the present invention.
Figure 27:
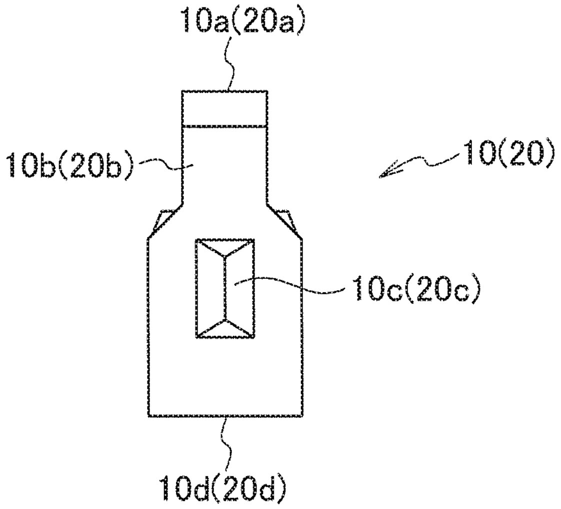
FIG. 27 is a left side view of the header-side terminal (an inside of the header) of the embodiment of the present invention.
Figure 28:
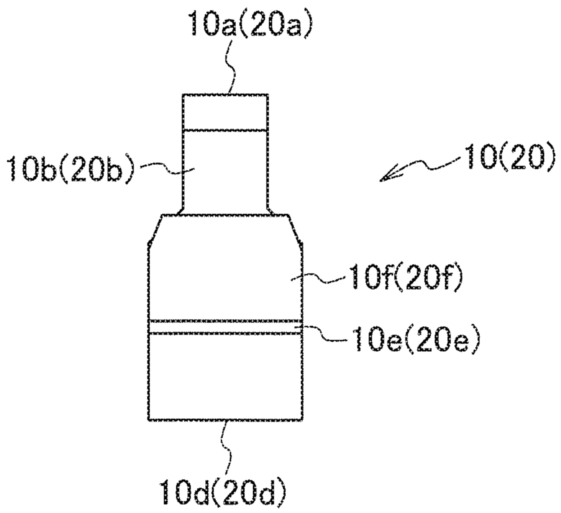
FIG. 28 is a right side view of the header-side terminal (an outside of the header) of the embodiment of the present invention.
Figure 29:
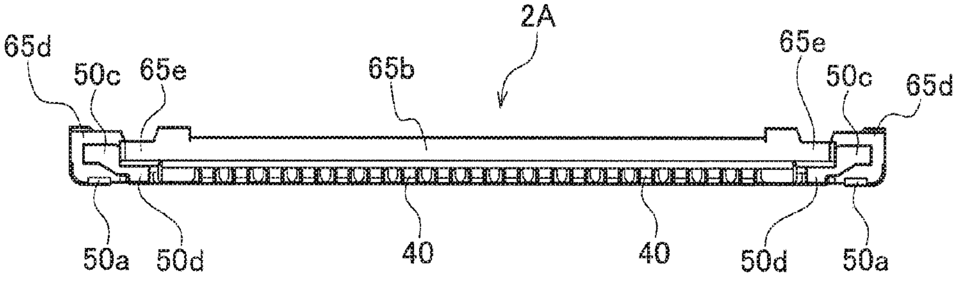
FIG. 29 is a front view of a socket of a different example of the embodiment of the present invention.
Figure 30:
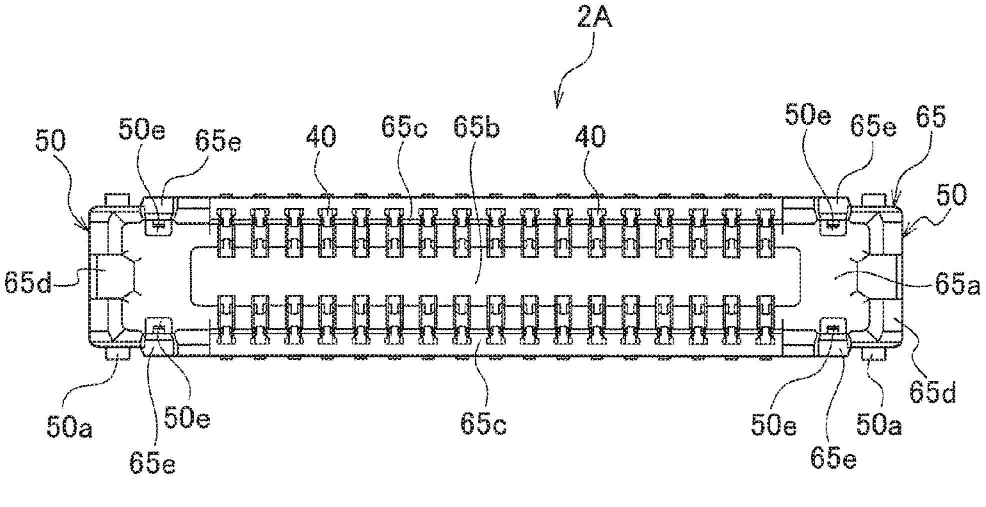
FIG. 30 is a plan view of the socket of the different example of the embodiment of the present invention.
Figure 31:
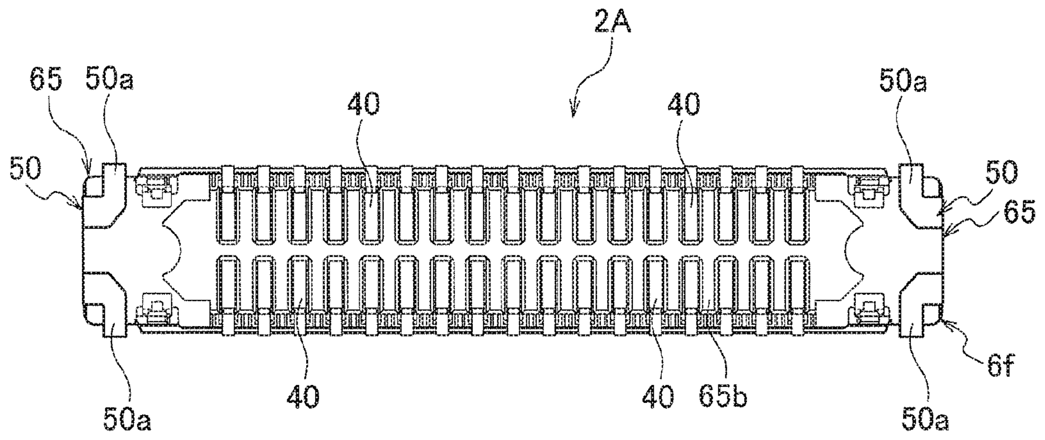
FIG. 31 is a bottom view of the socket of the different example of the embodiment of the present invention.
Figure 32:
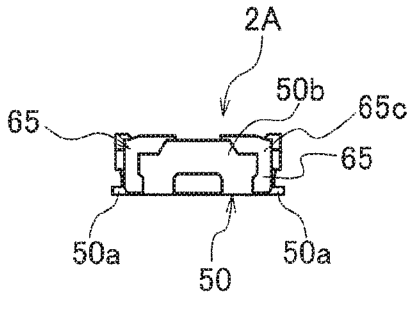
FIG. 32 is a side view of the socket of the different example of the embodiment of the present invention.
Figure 33:
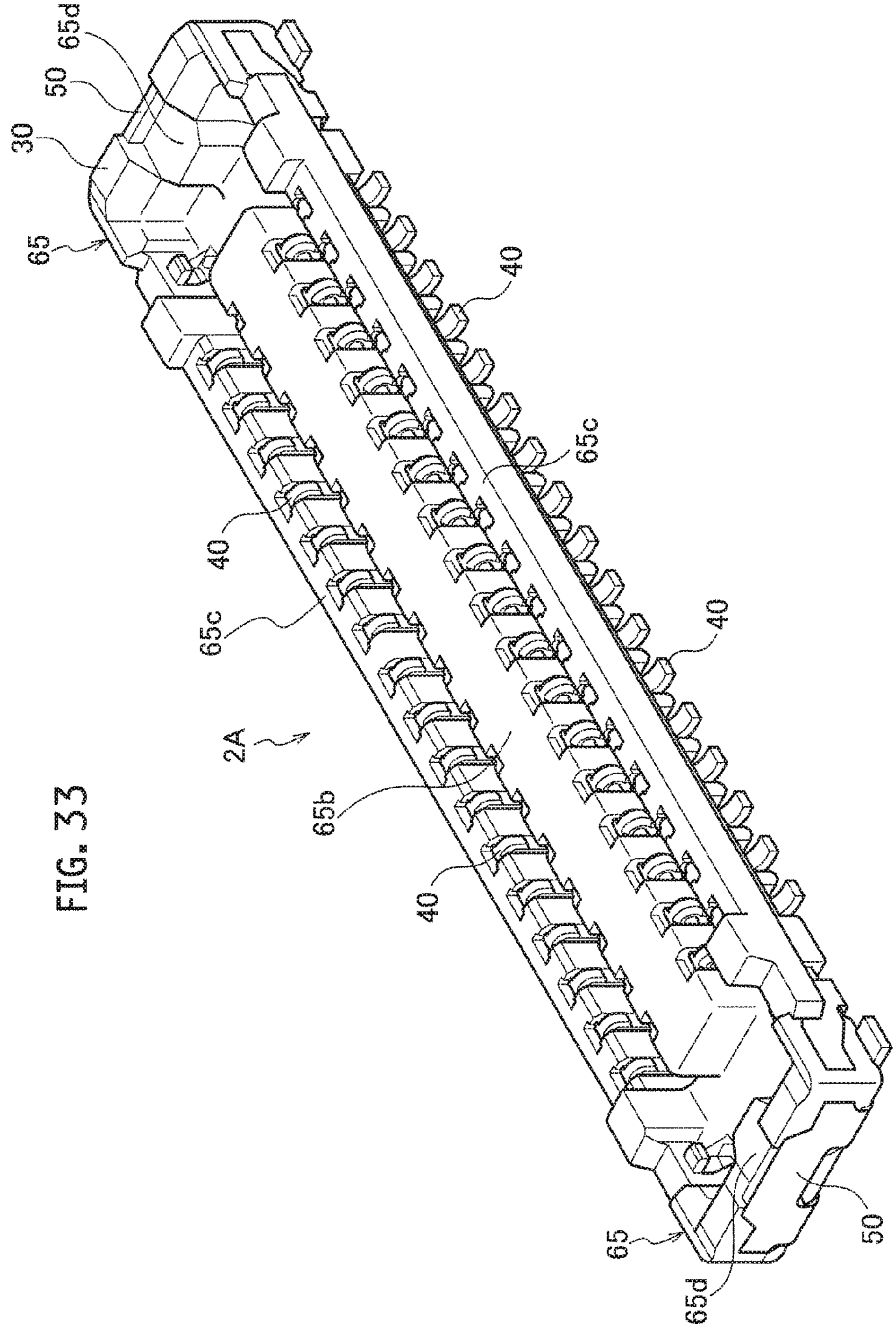
FIG. 33 is a first perspective view of the socket of the different example of the embodiment of the present invention.
Figure 34:
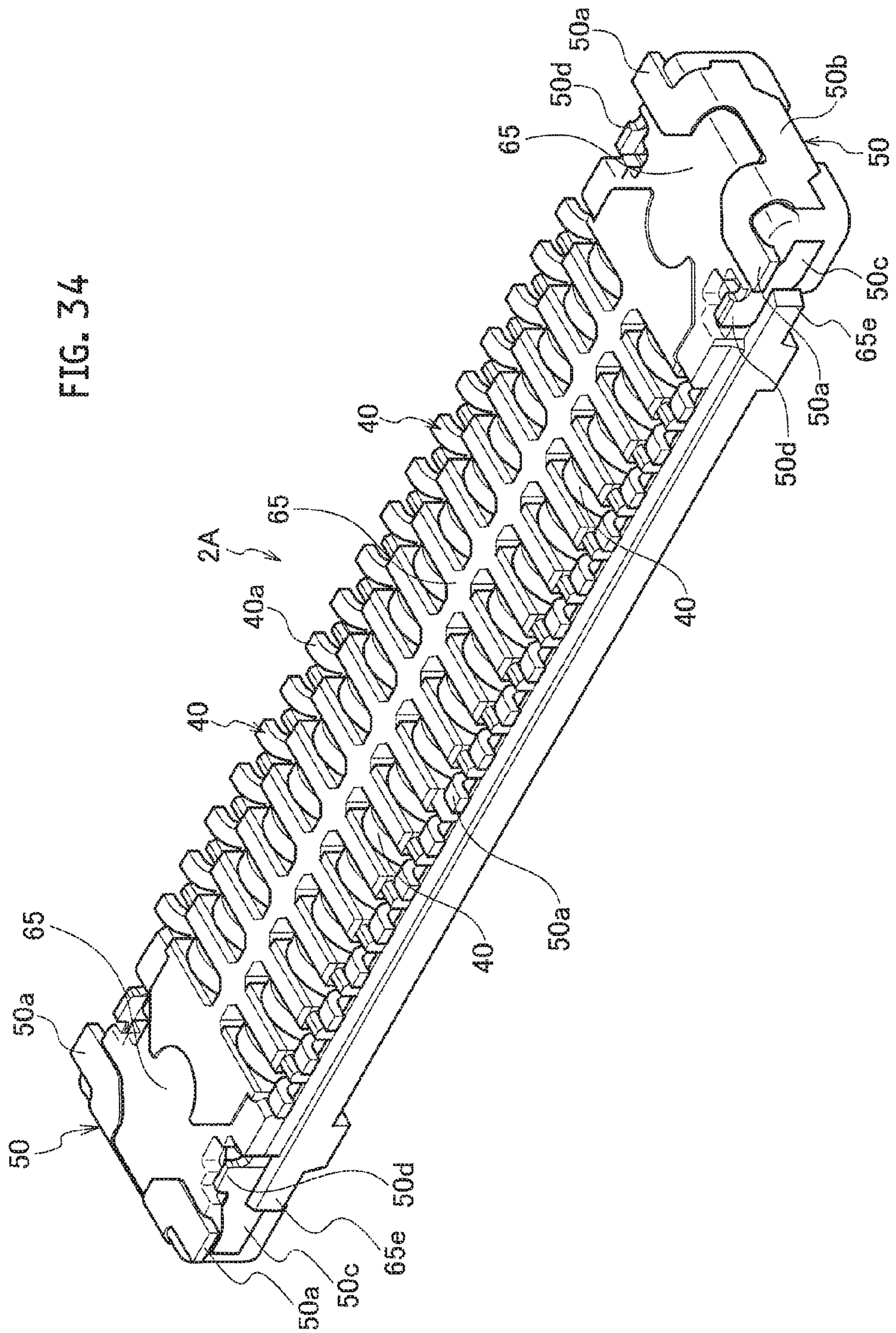
FIG. 34 is a second perspective view of the socket of the different example of the embodiment of the present invention.

In cross-sectional views shown in FIGS. 14 and 15, each rising portion 50*d* and the corresponding locking piece portion 50*e* are jointly shaped like the upended letter L. The rising portion 50*d* and the corresponding locking piece portion 50*e* enter the edge portion 60*c* from the under (see FIGS. 3 and 4), curve inside the edge portion 60*c*, and penetrate the edge portion 60*c*, thereafter projecting into the frame-shaped space 60*a*.

In the embodiment, both the projecting portion of each leg portions 50*a* and the lower end portion of the corresponding rising portion 50*d* shown in FIG. 14 are designed to be fixed to the circuit board 70 using solder. Since the socket 2 includes two soldered portions like this, the socket 2 is firmly fixed to the circuit board 70. Furthermore, the fixing of the lower end portion of the rising portion 50*d* to the circuit board 70 using the solder inhibits flexure of the socket-side retaining fitting 50 as a whole which is caused by rotational force around an axis extending in the width direction defined by the width dimension W2 of the socket-side retaining fitting 50 in FIG. 3.

There is a case where as indicated with an arrow Fout in FIG. 15, external force is applied in such a way as to pull the header-side retaining fitting 20 out of the corresponding socket-side retaining fitting 50. In this case, the locking piece portion 50*e* of the socket-side retaining fitting 50 locks the locked portion 20*e* of the header-side retaining fitting 20, and restricts the movement of the locked portion 20*e*. This inhibits the header-side retaining fitting 20 from coming off the socket-side retaining fitting 50. For this reason, in a case where the header-side retaining fitting 20 should not be pulled out of the socket-side retaining fitting 50, the header-side retaining fitting 20 is inhibited from being unexpectedly pulled out of the socket-side retaining fitting 50 by the occurrence of force less than force needed to pull the header-side retaining fitting 20 out of the socket-side retaining fitting 50 in a direction of the pulling. For example, in a case where pulling-out force less than the force needed to pull the header-side retaining fitting 20 out of the socket-side retaining fitting 50 occurs to the connector 120 due to falling or the like of the electronic device including the connector 120, the header 1 can be inhibited from being unexpectedly separated from the socket 2. For this reason, the locking piece portion 50*e* of the socket-side retaining fitting 50 and the locked portion 20*e* of the header-side retaining fitting 20 form a lock mechanism in which the locking piece portion 50*e* and the locked portion 20*e* can be unlocked from each other by the application of external force equal to or greater than the predetermined value. In short, the locking piece portion 50*e* functions to keep the header 1 and the socket 2 electrically connected to each other.

As shown in FIGS. 14 and 15, the edge portions 60*c* of the socket housing 60 include the covering portions 60*e* covering at least parts of the locking piece portions 50*e* of the socket-side retaining fittings 50. As shown in FIG. 15, each covering portion 60*e* causes reaction force Fin against the pulling-out force in the corresponding locking piece portion 50*e* when pulling-out force Fout occurs in a direction in the corresponding locked portion 20*e* comes off the locking piece portion 50*e*. Thereby, the covering portion 60*e* restricts the movement of the locking piece portion 50*e* of the socket-side retaining fittings 50 in a direction indicated with a corresponding turning arrow in FIGS. 14 and 15. In other words, the covering portion 60*e* inhibits outward movement of the locking piece portion 50*e* and the corresponding rising portion 50*d*. That is to say, flexure of the portion shaped like the upended letter L, as a cantilevered beam whose fixed end is the solder 280, is inhibited. Thereby, the occurrence of unexpected unlocking, that is to say, the locked portion 20*e* coming off the locking piece portion 50*e*, due to the flexure of the portion shaped like the upended letter L is securely prevented. To put it concretely, it is possible to securely prevent the occurrence of the unexpected separation of the connector 120, such as the header 1 coming off the socket 2 due to the falling of the electronic device in which the connector 120 is installed.

In addition, as described above, each socket-side retaining fitting 50 is fixed at the two parts to the conductor wiring pattern 275 of the circuit board 70 using the solders 280. To put it concretely, the leg portions 50*a* of each socket-side retaining fitting 50 shown in FIGS. 3, 4, 46 to 53, and 54 are fixed to the conductor wiring pattern 275 of the circuit board 70 using the solders 280. Furthermore, the tip ends of the arm portions 50*c*, which are concurrently the lower ends of the rising portions 50*d*, in the socket-side retaining fitting 50 shown in FIGS. 14, 15, 40 to 53, and 54 are fixed to the conductor wiring pattern 275 of the circuit board 70 using the solders 280.

The covering portions 60*e* of the socket housing 60 are provided at positions which make the covering portions 60*e* prevent the solders 280, as melted, from rising up to the locking piece portions 50*e* of the socket-side retaining fittings 50. For this reason, each covering portions 60*e* brings about two effects, that is to say, an effect of preventing the locked portion 20*e* from coming off the locking piece portion 50*e*, and an effect of preventing the solder 280, as melted, from rising along the surface of the rising portion 50*d*.

As described above, part of each socket-side terminal 40 and part of each socket-side retaining fittings 50 are attached to the socket housing 60 by the insert molding. The covering portions 60*e* are formed integrally with the rest of the socket housing by the insert molding in the same step. For this reason, the covering portions 60*e* can be formed without increasing the number of production steps.

Referring to FIGS. 16 to 19, descriptions will be provided for a header 1A of a different example of the embodiment.

The header 1A of the different example includes a header housing 35 instead of the header housing 30. The header housing 35 includes: a bottom surface portion 35*a*; two edge portions 35*b* rising from the bottom surface portion 35*a*; and two edge portions 35*c* rising from the bottom surface portion 35*a*. The two edge portions 35*b* each extend in the lengthwise direction of the header 1A, and both face each other. The two edge portions 35*c* each extend in the width direction of the header 1, and both face each other. The bottom surface portion 35*a*, the two edge portions 35*b* and the two edge portions 35*c* form a recessed portion in the center of the header housing 35.

The header 1A of the different example is different from the header 1 in that: the number of posts, or the number of heard-side terminals 10 is larger in the header 1A than in the header 1; and accordingly, the header housing 35 is longer than the header housing 30. Furthermore, the header housing 35 is different from the header housing 30 in that the header housing 35 includes a structure which receives the header-side terminals corresponding to the increased number.

The header housing 35 of the different example has the same configuration as the header housing 30, except for the above-described differences between the header housing 35 and the header housing 30. The configuration which is the same between the header housing 30 and the header housing 35 of the different example has already been described, and therefore will not be described repeatedly here.

FIGS. 20 to 28 show the header-side terminal 10 (the header-side retaining fitting 20) to be attached to the header 1 and the header 1A. As described above, the header-side terminal 10 and the header-side retaining fitting 20 have the same structure. The structure of the header-side terminal 10 and the header-side retaining fitting 20 is the same between the header 1 and the header 1A of the different example, and has already been described. For this reason, the structure of the header-side terminal 10 and the header-side retaining fitting 20 will not be described repeatedly here.

The header 1A of the different example has the same configuration as the header 1, except for the above-described differences.

Referring to FIGS. 29 to 36, descriptions will be provided for a socket 2A of the different example of the embodiment.

The socket 2A of the different example includes a socket housing 65 instead of the socket housing 60. The socket housing 65 includes a frame-shaped space 65*a* extending along the four sides of the rectangle of the socket housing 65. The frame-shaped space 65*a* is surrounded by: two mutually-facing edge portions 65*c* each extending in the long-side direction of the rectangle; and two mutually-facing edge portions 65*d* each extending in the short-side direction of the rectangle. The frame-shaped space 65*a* surrounds an island portion 65*b* positioned at the center of the frame-shaped space 65*a*, and shaped almost like a rectangular parallelepiped. In the socket 2A, covering portions 65*e* of the socket housing 65 restrict the movement of the locking piece portions 50*e* of the socket-side retaining fittings 50.

The socket 2A of the different example is different from the socket 2 in that: the number of socket-side terminals 40 is larger in the socket 2A than in the socket 2; and accordingly, the socket housing 65 is longer than the socket housing 60. The socket housing 65 is further different from the socket housing 60 in that the socket housing 65 includes cut portions which receive the socket-side terminals corresponding to the increased number. The socket 2A of the different example has the same configuration as the socket 2, except for the above-described differences.

Figure 35:
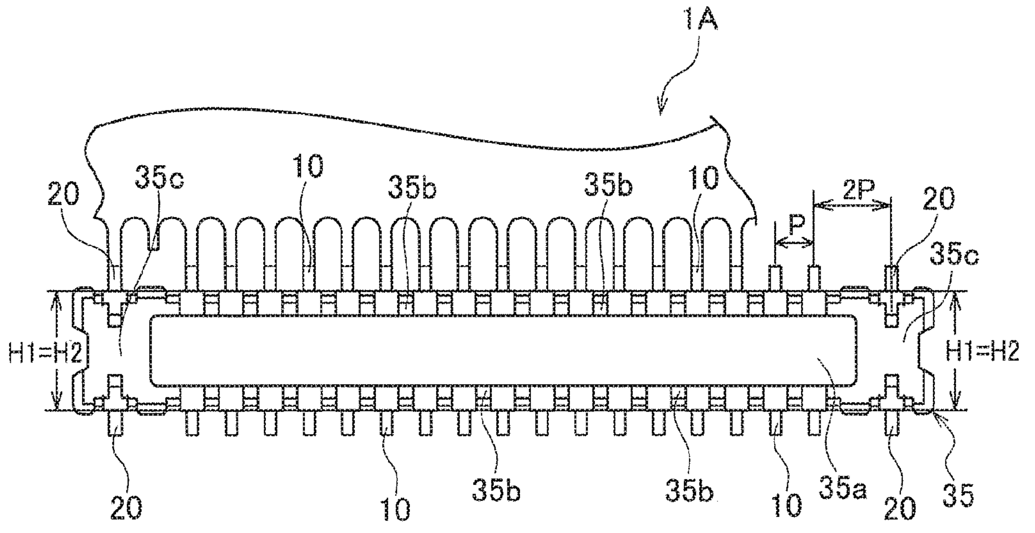
FIG. 35 is a diagram for explaining: a relationship between a pitch between header-side terminals and a pitch between a header-side terminal and a corresponding header-side retaining fitting in the header of the different example of the embodiment of the present invention; and a relationship between an interval between locked portions of mutually-facing header-side terminals and an interval between locked portions of mutually-facing header-side retaining fittings in the header of the different example of the embodiment of the present invention.
Figure 36:
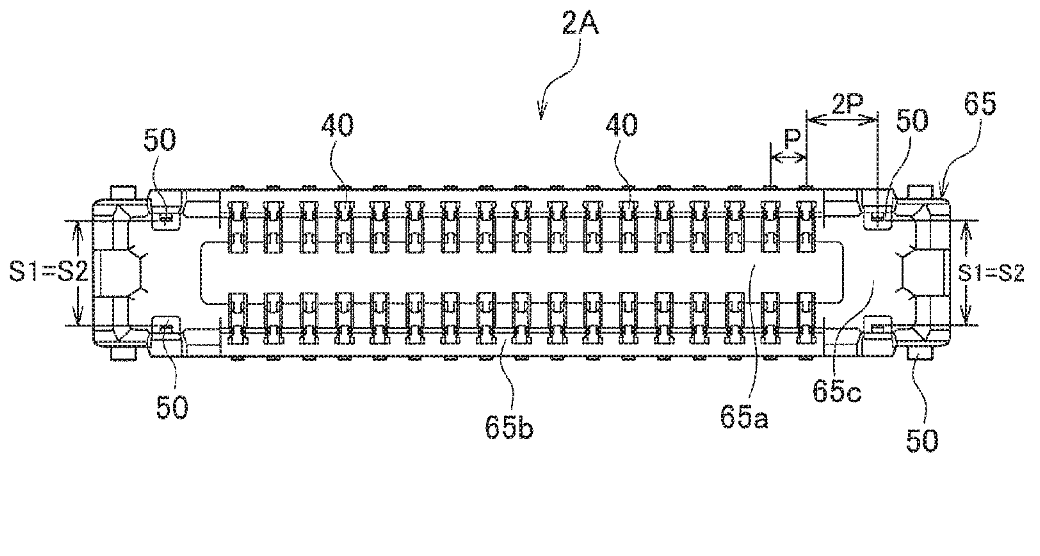
FIG. 36 is a diagram for explaining: a relationship between a pitch between socket-side terminals and a pitch between a socket-side terminal and a corresponding socket-side retaining fitting in the socket of the different example of the embodiment of the present invention; and a relationship between an interval between locking piece portions of mutually-facing socket-side terminals and an interval between locking piece portions of mutually-facing socket-side retaining fittings in the socket of the different example of the embodiment of the present invention.
Figure 37:
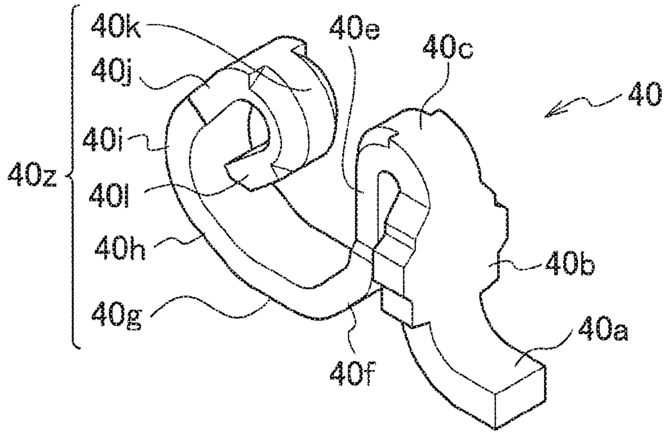
FIG. 37 is a first perspective view of the socket-side terminal of the embodiment of the present invention.
Figure 38:
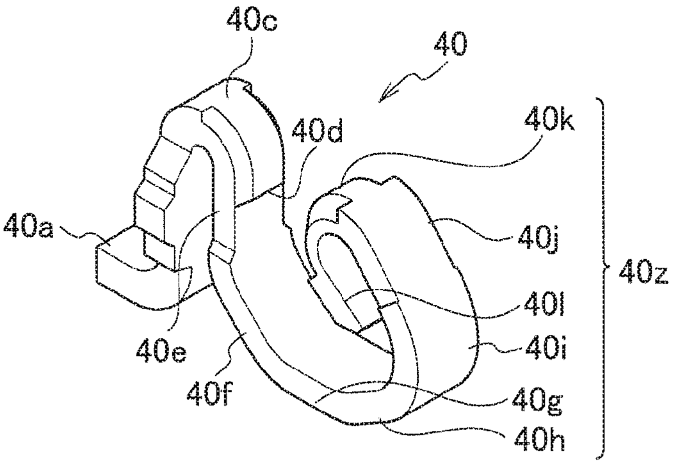
FIG. 38 is a second perspective view of the socket-side terminal of the embodiment of the present invention.
Figure 39:
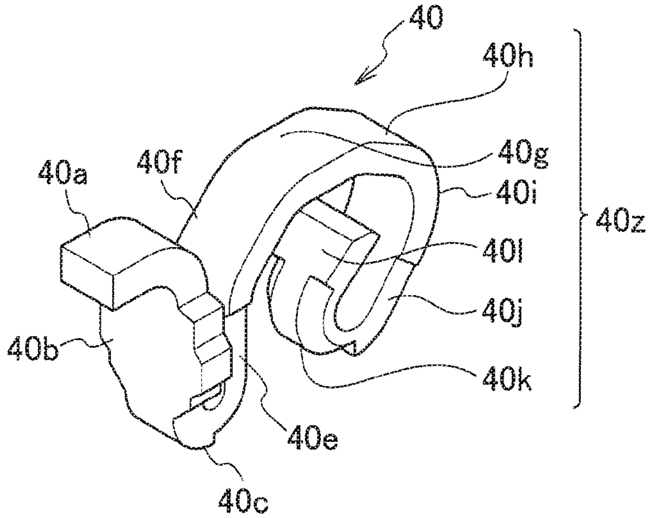
FIG. 39 is a third perspective view of the socket-side terminal of the embodiment of the present invention.
Figure 40:
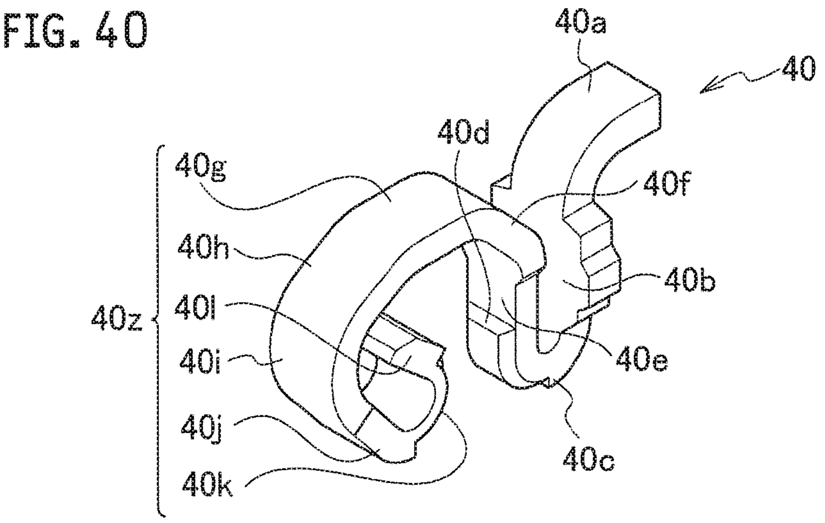
FIG. 40 is a fourth perspective view of the socket-side terminal of the embodiment of the present invention.
Figure 41:
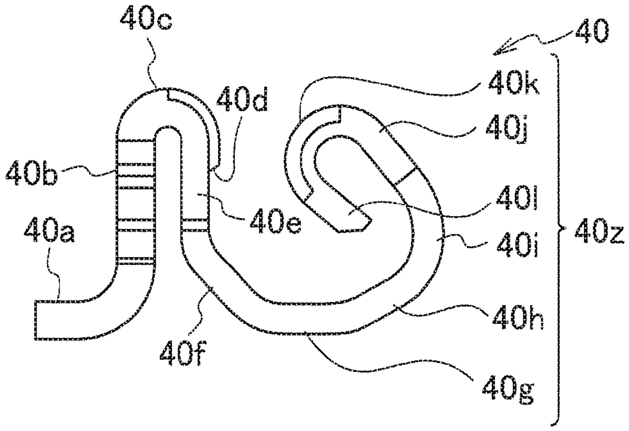
FIG. 41 is a front view of the socket-side terminal of the embodiment of the present invention.
Figure 42:
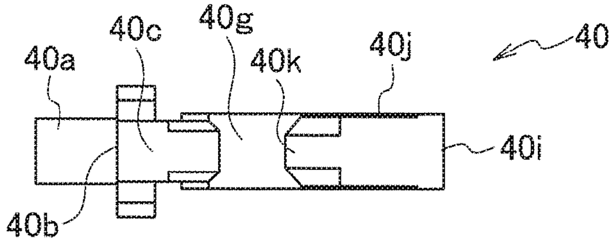
FIG. 42 is a plan view of the socket-side terminal of the embodiment of the present invention.
Figure 43:
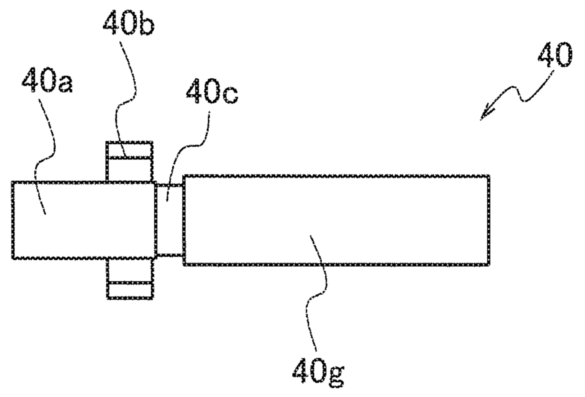
FIG. 43 is a bottom view of the header-side terminal of the embodiment of the present invention.
Figure 44:
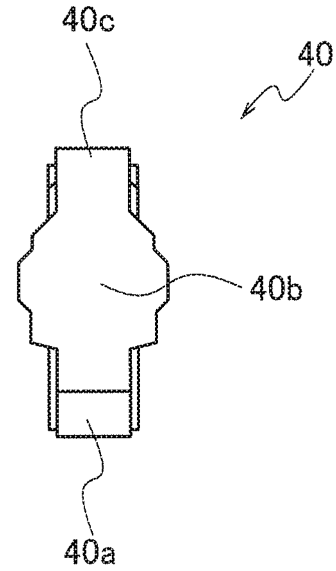
FIG. 44 is a left side view of the socket-side terminal (an outside of the socket) of the embodiment of the present invention.
Figure 45:
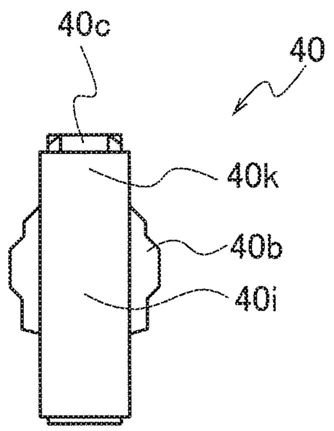
FIG. 45 is a right side view of the socket-side terminal (an inside of the socket) of the embodiment of the present invention.
Figure 46:
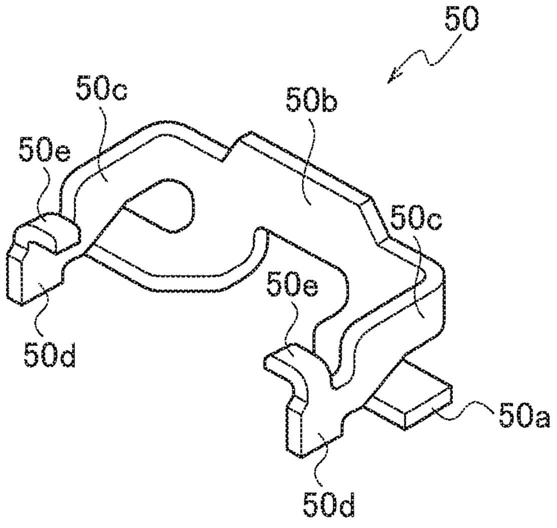
FIG. 46 is a first perspective view of the socket-side retaining fitting of the embodiment of the present invention.
Figure 47:
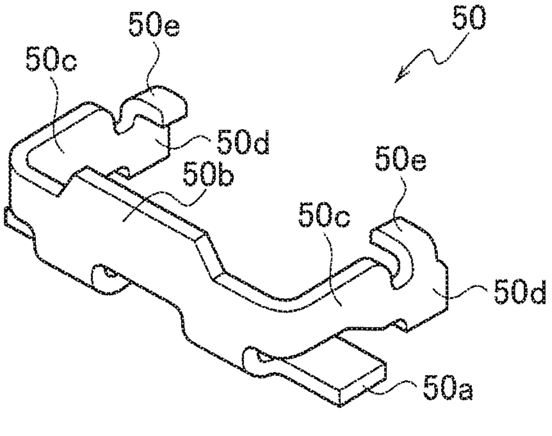
FIG. 47 is a second perspective view of the socket-side retaining fitting of the embodiment of the present invention.
Figure 48:
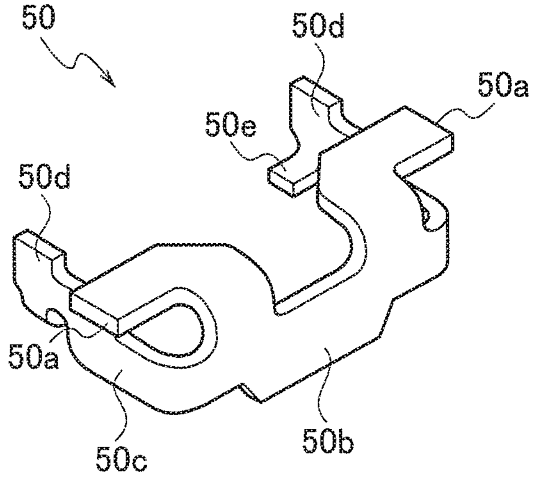
FIG. 48 is a third perspective view of the socket-side retaining fitting of the embodiment of the present invention.
Figure 49:
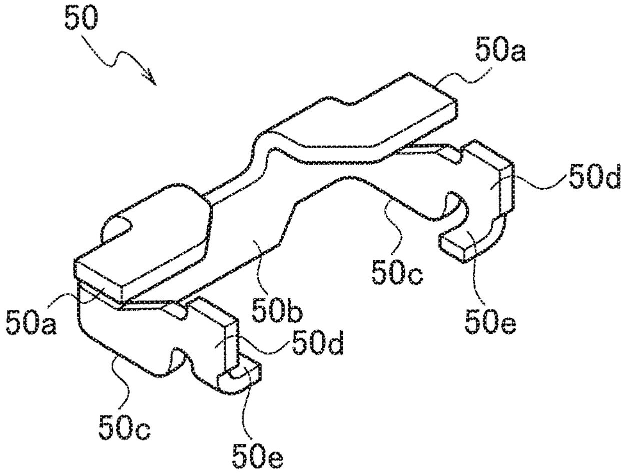
FIG. 49 is a fourth perspective view of the socket-side retaining fitting of the embodiment of the present invention.
Figure 50:
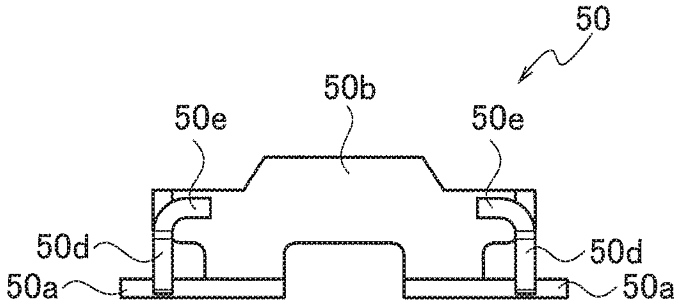
FIG. 50 is a front view of the socket-side retaining fitting of the embodiment of the present invention.
Figure 51:
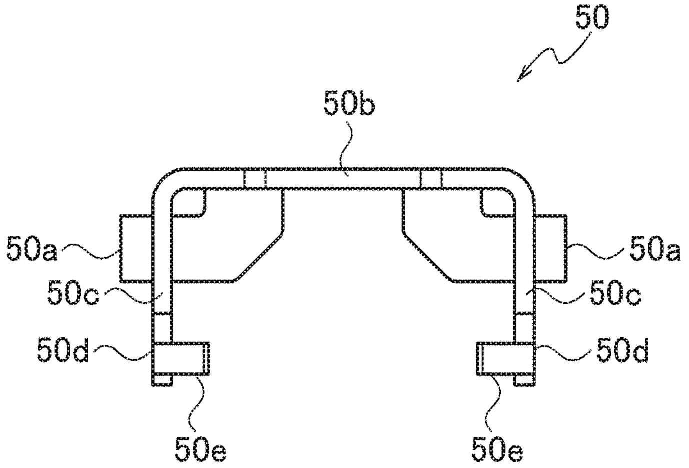
FIG. 51 is a plan view of the socket-side retaining fitting of the embodiment of the present invention.
Figure 52:
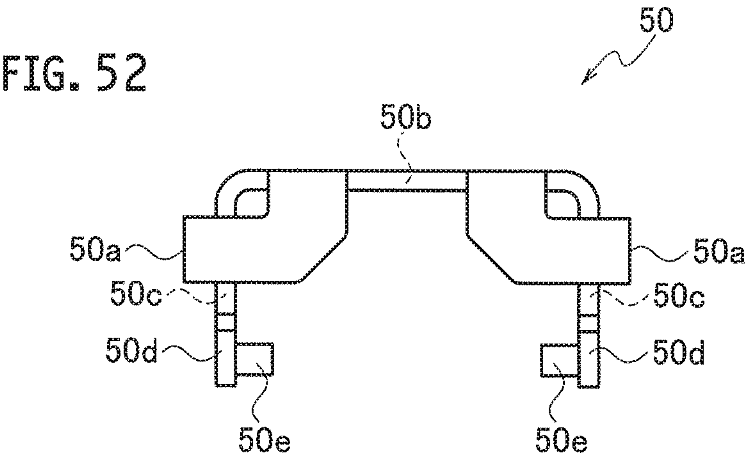
FIG. 52 is a bottom view of the socket-side retaining fitting of the embodiment of the present invention.
Figure 53:
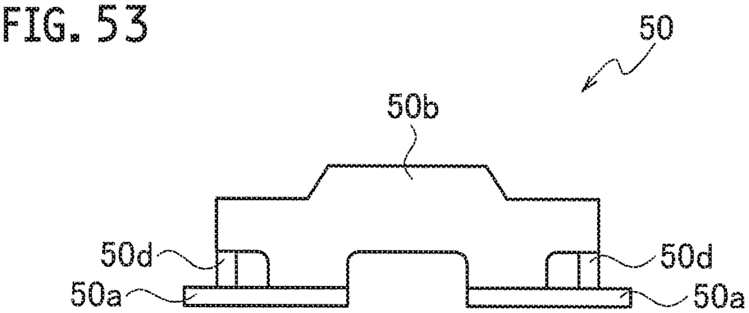
FIG. 53 is a back view of the socket-side retaining fitting of the embodiment of the present invention.
Figure 54:
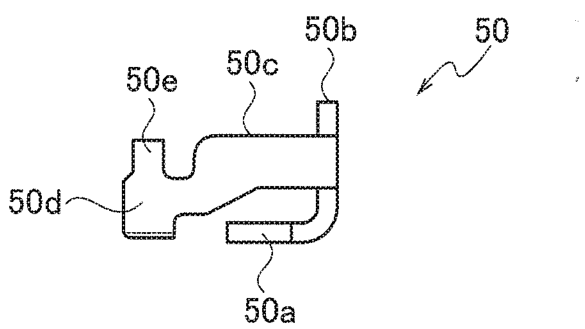
FIG. 54 is a side view of the socket-side retaining fitting of the embodiment of the present invention.
Figure 55:
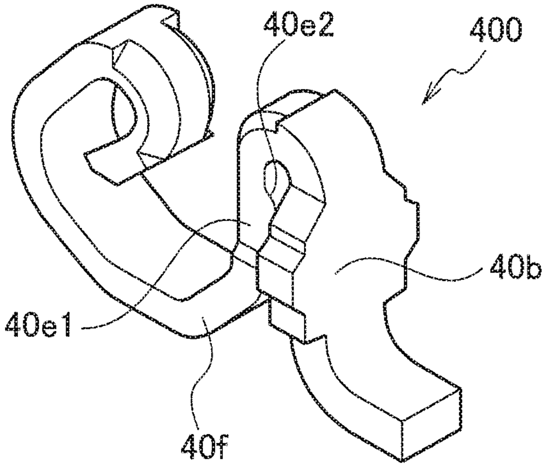
FIG. 55 is a first perspective view of a socket-side terminal of a different example of the embodiment of the present invention.
Figure 56:
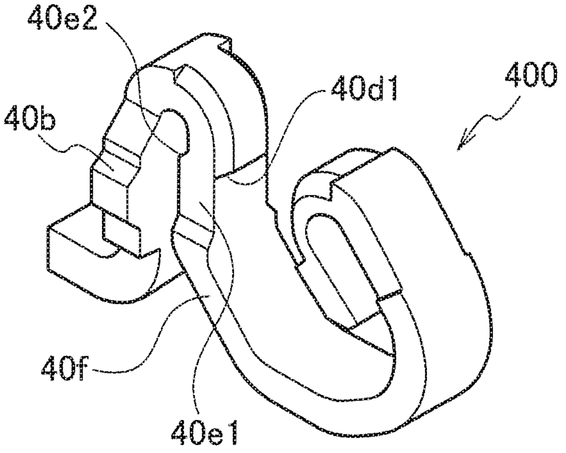
FIG. 56 is a second perspective view of the socket-side terminal of the different example of the embodiment of the present invention.
Figure 57:
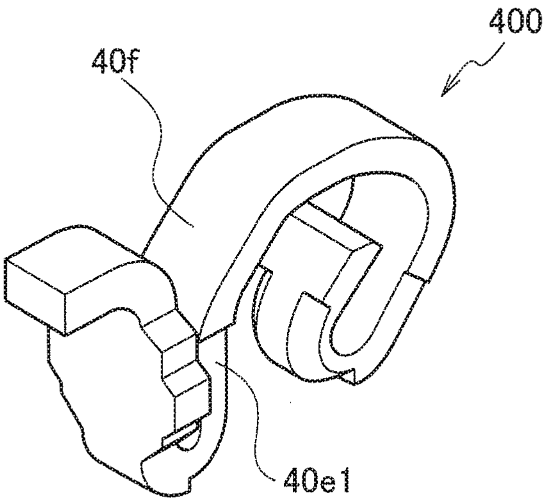
FIG. 57 is a third perspective view of the socket-side terminal of the different example of the embodiment of the present invention.
Figure 58:
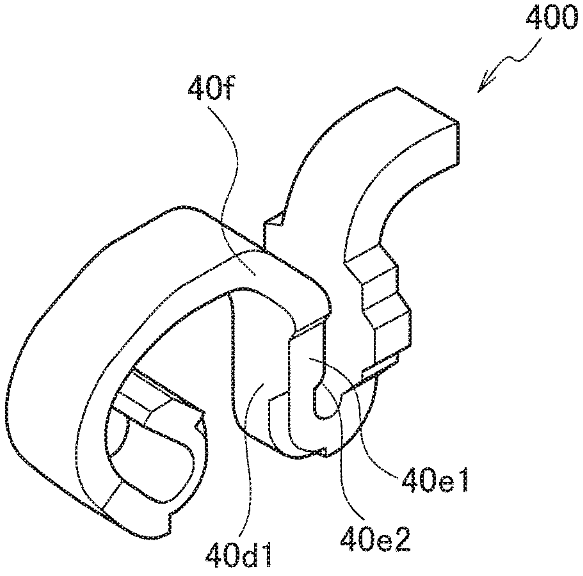
FIG. 58 is a fourth perspective view of the socket-side terminal of the different example of the embodiment of the present invention.
Figure 59:
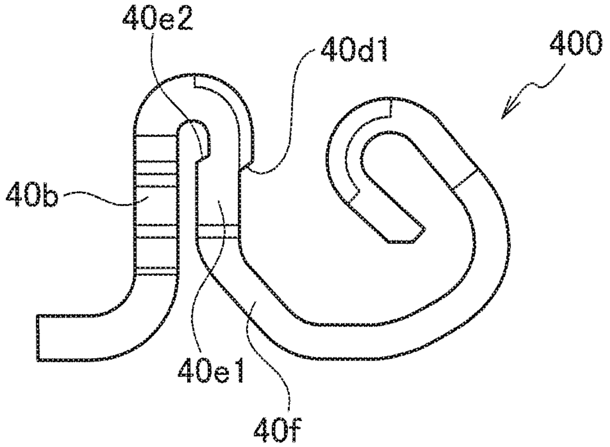
FIG. 59 is a front view of the socket-side terminal of the different example of the embodiment of the present invention.
Figure 60:
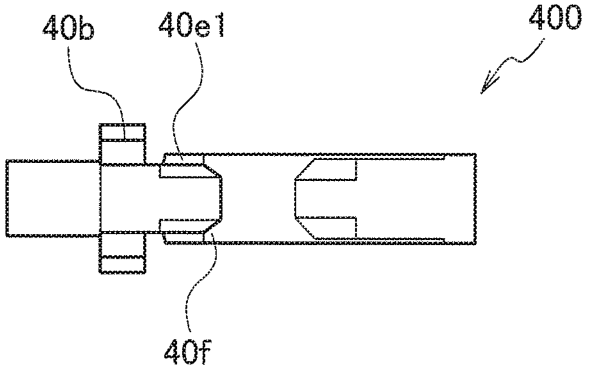
FIG. 60 is a plan view of the socket-side terminal of the different example of the embodiment of the present invention.
Figure 61:
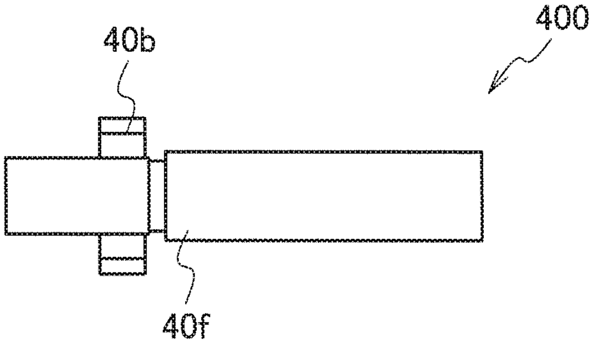
FIG. 61 is a bottom view of the socket-side terminal of the different example of the embodiment of the present invention.
Figure 62:
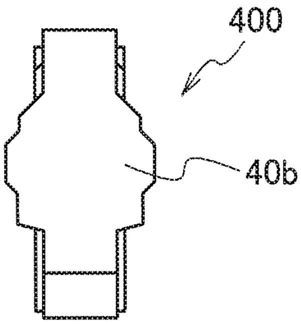
FIG. 62 is a left side view of the socket-side terminal (an outside of the socket) of the different example of the embodiment of the present invention.
Figure 63:
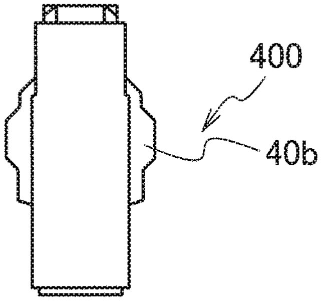
FIG. 63 is a right side view of the socket-side terminal (an inside of the socket) of the different example of the embodiment of the present invention.

Next, referring to FIGS. 35 and 36, descriptions will be provided for a pitch between terminals, and a distance between mutually-facing terminals, in the header and the socket.

As learned from FIG. 35, in the header 1A of the different example, the pitch between each two of the header-side terminals 10 is P, and is constant. Furthermore, the pitch between the header-side terminal 10 and the header-side retaining fitting 20 is 2P. In other words, the pitch between the header-side terminal 10 and the header-side retaining fitting 20 is an integer multiple of the pitch between each two of the header-side terminals 10. In addition, the header-side terminals 10 and the header-side retaining fittings 20 have the same shape. For these reasons, an interval H1 between the outer edges of the locked portions 10*e* of the mutually-facing header-side terminals 10 shown in FIG. 5 and an interval H2 between the outer edges of the locked portions 20*e* of the mutually-facing header-side retaining fittings 20 shown in FIG. 14 are equal to each other (H1=H2), as shown in FIG. 35. These make it very easy to design and manufacture the header-side terminals 10 and the header-side retaining fittings 20. Accordingly, it is possible to use a manufacturing method of cutting both the header-side terminals 10 and the header-side retaining fittings 20 from the same material.

As learned from FIG. 36, the pitch between each two of the socket-side terminals 40 is P, and is constant. Furthermore, the pitch between the socket-side terminal 40 and the socket-side retaining fitting 50 is 2P. In other words, the pitch between the socket-side terminal 40 and the socket-side retaining fitting 50 is an integer multiple of the pitch between each two of the socket-side terminals 40. In addition, a distance S1 between the inner edges of the locking portions 40*d* of the mutually-facing socket-side terminals shown in FIG. 5 and a distance S2 between the inner edges of the locking piece portions 50*e* of the mutually-facing socket-side retaining fittings 50 shown in FIG. 14 are equal to each other (S1=S2), as shown in FIG. 36. The structures of the socket-side terminals 40 and the socket-side retaining fittings 50 like these are those suitable to receive the header-side terminals 10 and the header-side retaining fittings 20.

FIGS. 37 to 45 show the socket-side terminal 40 to be attached to the socket 2 of the embodiment and the socket 2A of the different example. As described above, the socket-side terminals 40 are the same between the socket 2 and the socket 2A of the different example, and have already been described. For this reason, the socket-side terminals 40 will not be described repeatedly here.

FIGS. 46 to 54 show the socket-side retaining fitting 50 to be attached to the socket 2 of the embodiment and the socket 2A of the different example. As described above, the socket-side retaining fittings 50 are the same between the socket 2 and the socket 2A of the different example, and have already been described. For this reason, the socket-side retaining fittings 50 will not be described repeatedly here.

The socket 2A of the different example can bring about the same effect as the socket 2 does.

FIGS. 55 to 63 show a socket-side terminal 400 of a different example which can be attached to the socket 2 of the embodiment and the socket 2A of the different example. A falling portion 40*e*1 of the socket-side terminal 400 of the different example is different from the falling portion 40*e* of the socket-side terminal 40 in that the falling portion 40*e*1 includes a curving surface portion 40*e*2 facing a rising portion 40*b*. Furthermore, the falling portion 40*e*1 of the socket-side terminal 400 of the different example is different from the falling portion 40*e* of the socket-side terminal 40 in that the curving surface portion 40*e*2 is thicker in its lower portion than in its upper portion.

The reasons for the above-mentioned differences come from the difference between a method of manufacturing parts in the socket-side terminal 40 and a method of manufacturing parts in the socket-side terminal 400 of the different example, as follows. The locking portion 40*d* of the socket-side terminal 40 is formed from the base material by rolling forming. On the other hand, the locking portion 40*d*1 of the socket-side terminal 400 of the different example shown in FIGS. 55 to 63 is formed from the base material by simple bending forming. In short, the above-mentioned differences are caused by the difference between the rolling forming and the bending forming.

The parts of the socket-side terminal 400, except for the falling portion 40*e*1 and the locking portion 40*d*1 but inclusive of the inclined portion 40*f*, have the same structures as the corresponding parts of the socket-side terminal 40. The same structures have already been described. For this reason, the parts which have the same structures between the socket-side terminal 400 and the socket-side terminal 40 will not be described repeatedly here.

The socket-side terminal 400 of the different example can bring about almost the same effect as the socket-side terminal 40 does.

It should be noted that the foregoing embodiment is an example of the present invention. For this reason, it is a matter of course that: the present invention is not limited to the above-described embodiment; and various changes can be made to the present invention depending on designs and the like within a scope not departing from the technical idea related to the present invention, even in embodiments other than the present one.

INDUSTRIAL APPLICABILITY

The present invention can provide a socket, a connector using the socket, and a header used in the connector, which are capable of inhibiting the header-side retaining fittings from being unlocked from the socket-side retaining fittings under a situation where the unlocking is not allowed.

The invention claimed is:

1. A socket including a socket-side terminal and being configured to be electrically connected to a header including a header-side terminal coming in contact with the socket-side terminal, the socket comprising:

a socket housing to which the socket-side terminal is attached; and a socket-side retaining fitting attached to the socket housing, wherein the socket-side retaining fitting includes:

a central portion which extends in a width direction of the socket housing, an arm portion extending from the central portion, the arm portion extending in a lengthwise direction of the socket housing, a rising portion extending from a tip end portion of the arm portion toward the header, and a locking piece portion being a part continuing to an upper end portion of the rising portion while curving, and configured to lock a locked portion of a header-side retaining fitting attached to the header, and the socket housing includes a covering portion provided in such a way as to cover at least part of the locking piece portion, and configured to restrict movement of the locking piece portion.

2. The socket according to claim 1, wherein the socket-side retaining fitting is attached to the socket housing by insert molding, and the covering portion is formed integrally with the rest of the socket housing, other than the covering portion, by the insert molding.

3. A connector comprising:

the socket according to claim 1; and the header configured to be electrically connected to the socket.

4. A socket including a socket-side terminal and being configured to be electrically connected to a header including a header-side terminal coming in contact with the socket-side terminal, the socket comprising:

a socket housing to which the socket-side terminal is attached; and a socket-side retaining fitting attached to the socket housing, wherein the socket-side retaining fitting includes:

a rising portion extending toward the header, a locking piece portion being a part continuing to an upper end portion of the rising portion while curving, and configured to lock a locked portion of a header-side retaining fitting attached to the header, and the socket housing includes a covering portion provided in such a way as to cover at least part of the locking piece portion, and configured to restrict movement of the locking piece portion, and wherein a lower end portion of the rising portion is fixed to a circuit board using solder, and the covering portion is placed at such a position as to prevent the solder, as melted, from rising up to the locking piece portion along a surface of the rising portion.

5. A socket including a socket-side terminal and being configured to be electrically connected to a header including a header-side terminal coming in contact with the socket-side terminal, the socket comprising:

a socket housing to which the socket-side terminal is attached; and a socket-side retaining fitting attached to the socket housing, wherein the socket-side retaining fitting includes:

a rising portion extending toward the header, and a locking piece portion being a part continuing to an upper end portion of the rising portion while curving, and configured to lock a locked portion of a header-side retaining fitting attached to the header, and the socket housing includes a covering portion provided in such a way as to cover at least part of the locking piece portion, and configured to restrict movement of the locking piece portion a lower end portion of the rising portion is fixed to a circuit board using solder, and the covering portion is placed at such a position as to prevent the solder, as melted, from rising up to the locking piece portion along a surface of the rising portion, and wherein the socket housing as a whole is shaped substantially like a rectangular parallelepiped, the socket-side retaining fitting includes:

a central portion provided in such a way as to be exposed at a side surface of the socket housing, an arm portion extending from the central portion to a predetermined position in a front of the socket housing in such a way as to be exposed at the front surface, and a leg portion extending from the central portion along a bottom surface of the socket housing, and projecting from the front surface of the socket housing, and the leg portion is fixed to the circuit board using different solder.

6. A socket including a socket-side terminal and being configured to be electrically connected to a header including a header-side terminal coming in contact with the socket-side terminal, the socket comprising:

a socket housing to which the socket-side terminal is attached; and a socket-side retaining fitting attached to the socket housing, wherein the socket-side retaining fitting includes:

a rising portion extending toward the header, and a locking piece portion being a part continuing to an upper end portion of the rising portion while curving, and configured to lock a locked portion of a header-side retaining fitting attached to the header, and the socket housing includes a covering portion provided in such a way as to cover at least part of the locking piece portion, and configured to restrict movement of the locking piece portion, and wherein the socket housing as a whole is shaped substantially like a rectangular parallelepiped, the socket-side retaining fitting includes:

a central portion provided in such a way as to be exposed at a side surface of the socket housing, and an arm portion extending from the central portion to a predetermined position in a front surface of the socket housing in such a way as to be exposed at the front surface, the rising portion extends from a tip end portion of the arm portion toward the header, and the locking piece portion penetrates the covering portion while curving from the upper end portion of the rising portion toward an inside of the rectangular parallelepiped, and projects to a space inside edge portions of the socket housing.

* * * * *